US007518906B2

(12) United States Patent
Ikegawa et al.

(10) Patent No.: US 7,518,906 B2
(45) Date of Patent: Apr. 14, 2009

(54) MAGNETO-RESISTIVE ELEMENT

(75) Inventors: Sumio Ikegawa, Musashino (JP);
Masahiko Nakayama, Fuchu (JP);
Tadashi Kai, Tokyo (JP); Eiji Kitagawa, Sagamihara (JP); Hiroaki Yoda, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 329 days.

(21) Appl. No.: 11/378,351

(22) Filed: Mar. 20, 2006

(65) Prior Publication Data

US 2007/0070689 A1    Mar. 29, 2007

(30) Foreign Application Priority Data

Sep. 29, 2005   (JP)   ............................. 2005-285054

(51) Int. Cl.
*G11C 11/00* (2006.01)

(52) U.S. Cl. .................. 365/158; 365/171; 365/173

(58) Field of Classification Search ............... 365/158, 365/171, 173
See application file for complete search history.

(56) References Cited

U.S. PATENT DOCUMENTS 6,005,800 A    12/1999   Koch et al.

| | | | |
|---|---|---|---|
| 6,104,633 A | 8/2000 | Abraham et al. | |
| 6,501,678 B1 * | 12/2002 | Lenssen et al. | ............. 365/173 |
| 6,798,691 B1 | 9/2004 | Ounadjela et al. | |
| 6,912,152 B2 * | 6/2005 | Iwata et al. | ................. 365/158 |
| 2003/0169147 A1 | 9/2003 | Higo | |
| 2004/0042297 A1 | 3/2004 | Iwata et al. | |
| 2005/0230771 A1 | 10/2005 | Ha et al. | |

FOREIGN PATENT DOCUMENTS

JP    11-273337    10/1999
JP    2003-78112    3/2003

OTHER PUBLICATIONS

U.S. Appl. No. 11/244,153, filed Oct. 6, 2005, Masahiko Nakayama et al.
Y.K. Ha, et al., "MRAM with novel shaped cell using synthetic anti-ferromagnetic free layer", Symposium on VLSI Technology Digest of Technical Papers, 2004, pp. 24-25.

* cited by examiner

*Primary Examiner*—Son Dinh
(74) *Attorney, Agent, or Firm*—Oblon, Spivak, McClelland, Maier & Neustadt, P.C.

(57) ABSTRACT

A magneto-resistive element according to an aspect of the present invention includes a free layer whose magnetized state changes and a pinned layer whose magnetized state is fixed. The free layer comprises first and second ferromagnetic layers and a non-magnetic layer which is arranged between the first and second ferromagnetic layers. An intensity of exchange coupling between the first and second ferromagnetic layers is set so that an astroid curve in a hard axis direction opens.

18 Claims, 27 Drawing Sheets

*1 indicates a state where only a magnetic field due to a write current flowing through a word line is applied.

*2 indicates a state where only a magnetic field due to a write current flowing through a bit line is applied.

SAF structure (J=0.02erg/cm$^2$), Hx=0, Hy=75Oe

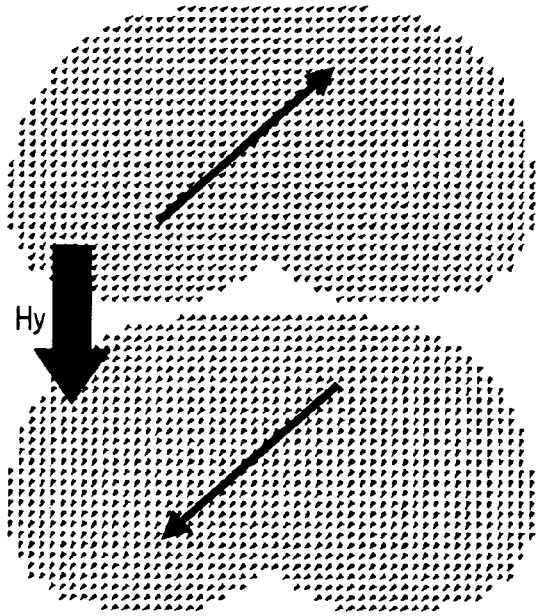

Ferromagnetic layer B
(with small anisotropic
magnetic field intensity)

Ferromagnetic layer A
(with large anisotropic
magnetic field intensity)

FIG. 27

SAF structure (J=0.02erg/cm$^2$), Hx=0, Hy=150Oe

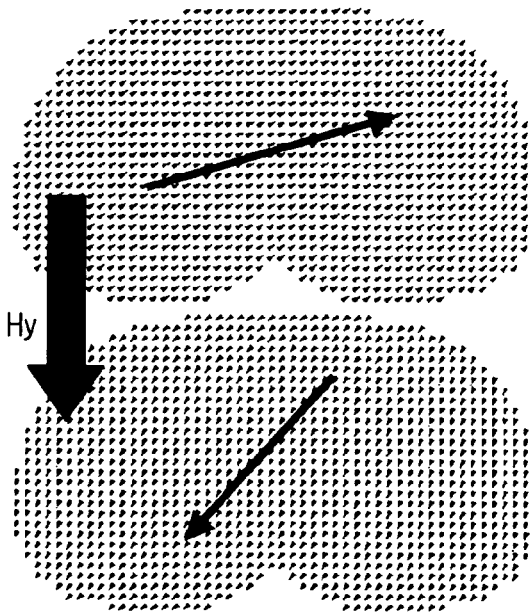

Ferromagnetic layer B
(with small anisotropic
magnetic field intensity)

Ferromagnetic layer A
(with large anisotropic
magnetic field intensity)

FIG. 28

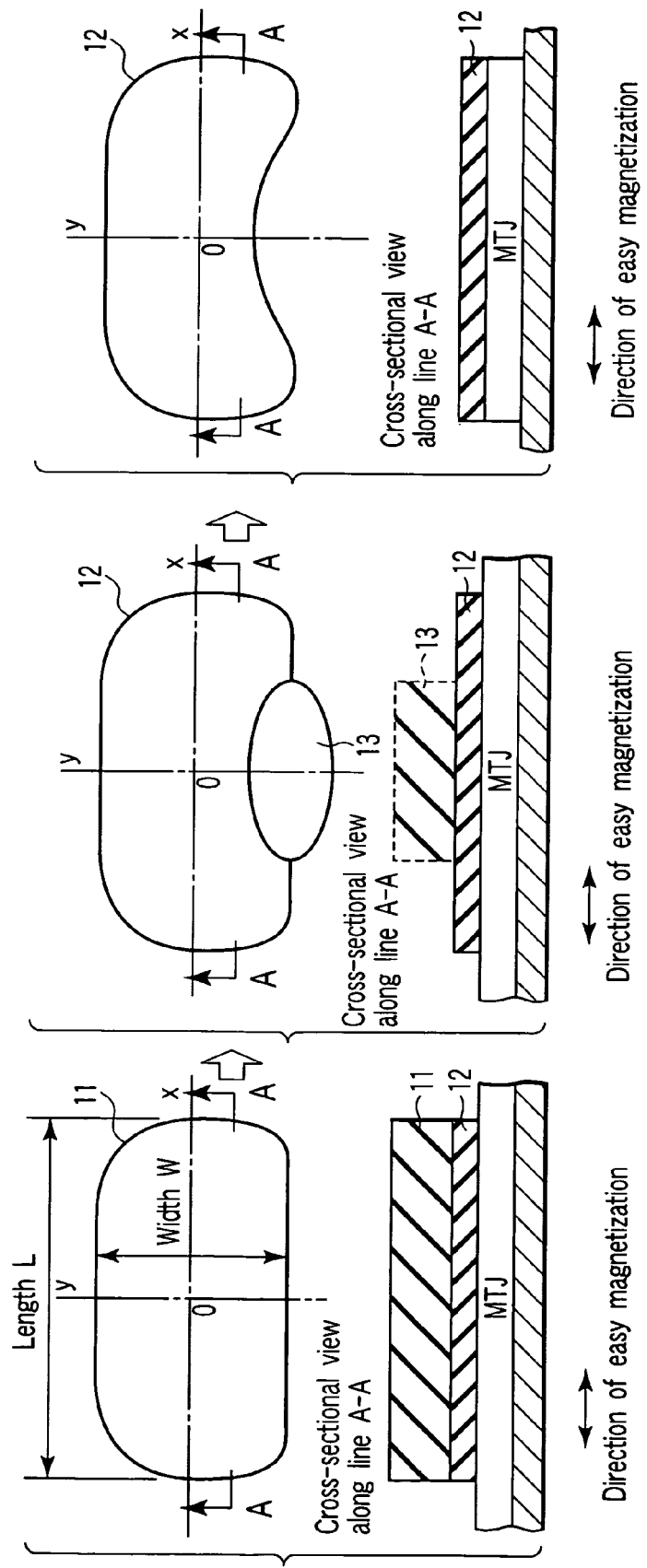
F I G. 33 A   F I G. 33 B   F I G. 33 C

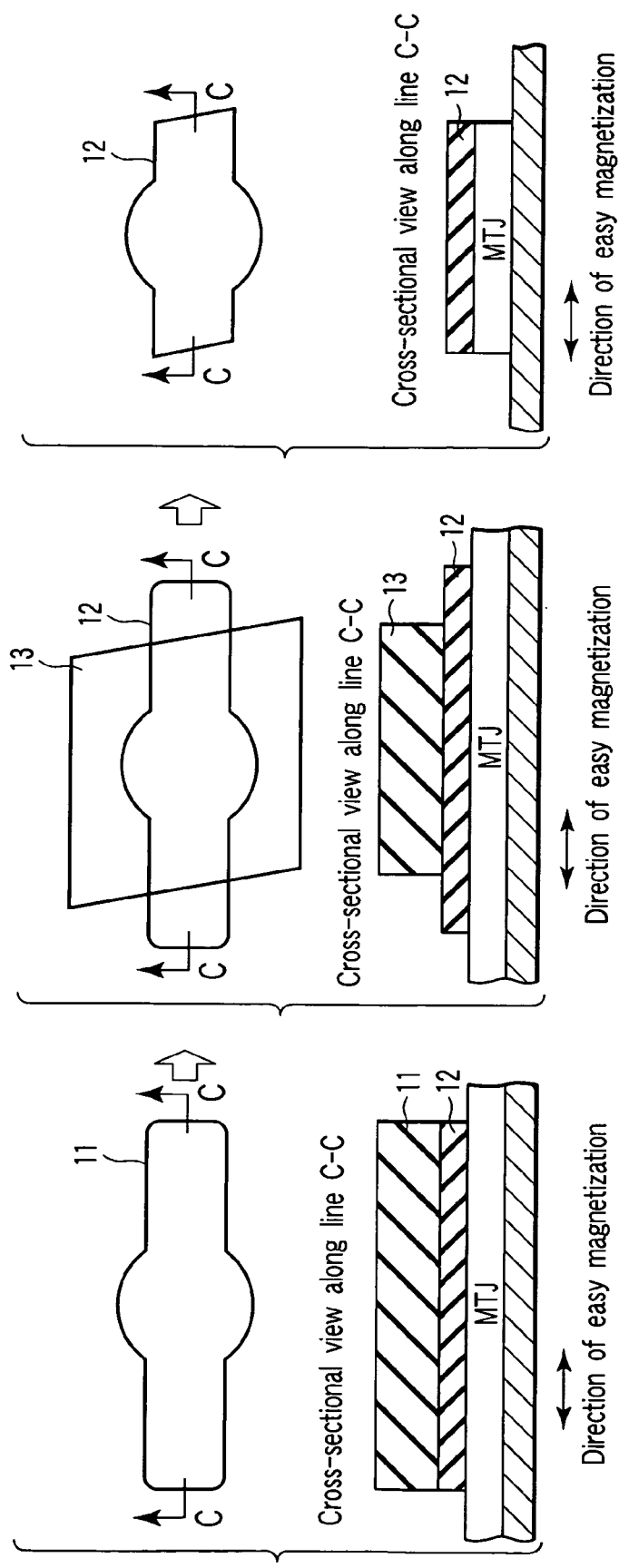

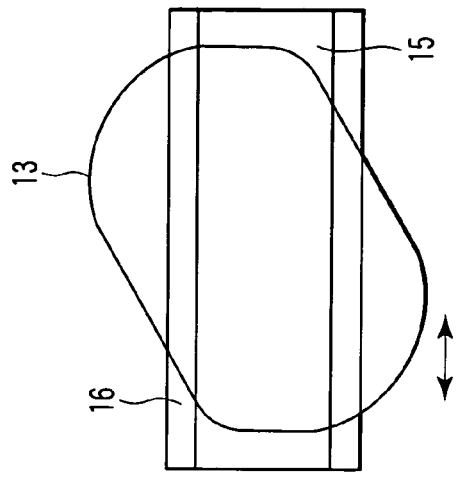
FIG. 37C
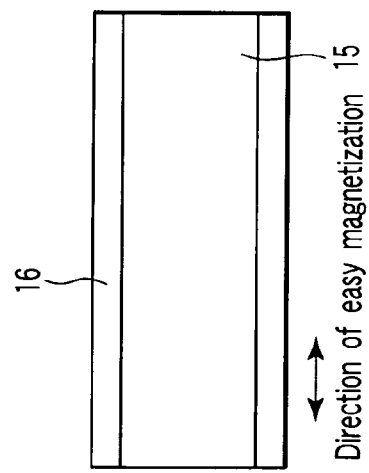
FIG. 37B
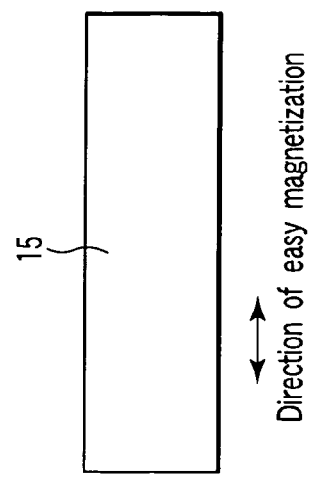
FIG. 37A
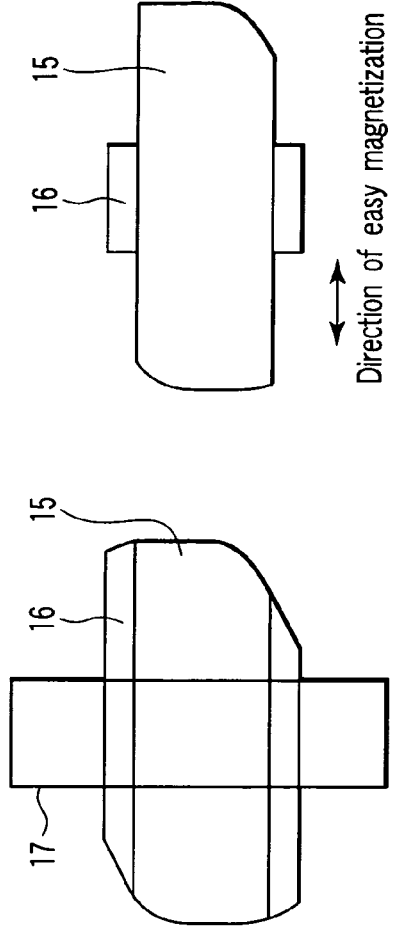
FIG. 37F
FIG. 37E
FIG. 37D

MAGNETO-RESISTIVE ELEMENT

CROSS-REFERENCE TO RELATED APPLICATIONS

This application is based upon and claims the benefit of priority from prior Japanese Patent Application No. 2005-285054, filed Sep. 29, 2005, the entire contents of which are incorporated herein by reference.

BACKGROUND OF THE INVENTION

1. Field of the Invention

The present invention relates to a shape and a structure of a magneto-resistive element and is applied to a magnetic random access memory, in particular.

2. Description of the Related Art

Conventionally, a variety of types of solid magnetic memories have been proposed. Recently, a magnetic random access memory using magneto-resistive elements that exhibit a giant magneto-resistive effect is proposed, most of which magneto-resistive elements utilize a ferromagnetic tunnel junction.

A ferromagnetic tunnel junction has a laminated structure of, for example, ferromagnetic layer/insulation layer (tunnel barrier layer)/ferromagnetic layer. A tunnel current flows through the insulation layer, when a voltage is applied to the insulation layer in this structure. In this case, tunnel conductance of the ferromagnetic tunnel junction changes in proportion to a cosine of a relative angle between the two ferromagnetic layers.

That is, when the two ferromagnetic layers are magnetized in the same direction (parallel to each other), the junction resistance value is minimized, and when they are magnetized in the opposite directions (anti-parallel to each other), the value is maximized.

Such a phenomenon is called a tunneling magneto-resistive (TMR) effect. For example, recently, a rate of change (MR rate) in resistance value of a magnetic tunnel junction (MTJ) element owing to the TMR effect is reported to be as high as 200% or more.

In a magneto-resistive element having a ferromagnetic tunnel junction, one of two ferromagnetic layers is defined as a pinned layer whose magnetized state is fixed and the other is defined as a free layer whose magnetized state changes with data. For example, if the pinned layer and the free layer are magnetized parallel to each other, stored data is supposed to be "0", and if they are magnetized anti-parallel to each other, it is supposed to be "1".

Data is written by, for example, applying a magnetic field generated by a write current flowing through a write line to a magneto-resistive element to thereby reverse a direction of magnetization of the free layer of the magneto-resistive element. On the other hand, data is read by, for example, supplying a read current through a ferromagnetic tunnel junction of the magneto-resistive element to thereby detecting a change in resistance of the ferromagnetic tunnel junction owing to the TMR effect.

By arranging such magneto-resistive elements as memory cells in an array, a memory cell array is configured. A variety of types of structures have been proposed for the memory cell array. For example, a one-transistor/one-MTJ type structure is known in which one switching transistor is connected to one magneto-resistive element in order to enable fast random access.

Another structure is proposed in which a diode and a ferromagnetic tunnel junction are connected in series in a region where a word line and a bit line intersect with each other.

However, to realize a magnetic random access memory practically, a lot of problems are to be solved.

For example, a disturbance problem must be solved which is caused by dispersion of a switching magnetic field of magneto-resistive elements that constitute a memory cell array. Further, it is also necessary to manuplate an astroid shape so that the magneto-resistive elements have write selectivity (see, for example, Jpn. Pat. Appln. KOKAI Publication No. 11-273337, U.S. Pat. No. 6,005,800, by Y. K. Ha et al., 2004 Symp, VLSI Technol. Dig. Tech. Papers, p. 24).

Further, it is also necessary to enable both fine patterning of magneto-resistive elements and reduction in a write current. Presently, if the magneto-resistive element is made smaller, its coercive force becomes larger, so that a larger switching magnetic field is required to reverse a magnetization direction. In this case, it is difficult to reduce a write current required to generate a magnetic field, thereby increasing power dissipation.

In addition, it is necessary to improve thermal stability to store data for a prolonged lapse of time. Thermal stability, which is judged by a parameter called a energy barrier ratio, $\alpha = \Delta E/k_B T$, is preferably larger. However, the energy barrier ratio is proportional to a volume and coercive force of a ferromagnetic layer, so that it is deteriorated as the magneto-resistive elements are fine-patterned more.

BRIEF SUMMARY OF THE INVENTION

A magneto-resistive element according to an aspect of the present invention comprises a free layer having first and second ferromagnetic layers and a non-magnetic layer which is arranged between the first and second ferromagnetic layers, in which an intensity of exchange coupling between the first and second ferromagnetic layers is set in such a manner that a astroid curve opens in the direction of hard magnetization, which means that the astroid does not intersect with the hard axis.

BRIEF DESCRIPTION OF THE SEVERAL VIEWS OF THE DRAWING

FIG. 27 is a view showing a modeled magnetization state of the magneto-resistive element under a magnetic field in the direction of hard magnetization;

FIG. 28 is a view showing another modeled magnetization state of the magneto-resistive element under a magnetic field in the direction of hard magnetization;

FIGS. 33A to 33C are views each showing a first example (C-shape) of a hard mask manufacturing method;

FIGS. 35A to 35C are views each showing a third example (propeller shape) of the hard mask manufacturing method;

FIGS. 37A to 37F are views each showing an example of a three-step process; and

DETAILED DESCRIPTION OF THE INVENTION

A magneto-resistive element of an aspect of the present invention will be described below in detail with reference to the accompanying drawings.

1. Outline

An embodiment of the present invention relates to a magneto-resistive element that comprises a free layer having a synthetic anti-ferromagnetic free layer (SAF) structure, and an intensity of exchange coupling of two ferromagnetic layers of the SAF structure is adjusted, thereby realizing such astroid characteristics that a write margin is large and write error is difficult to occur.

A fundamental structure of the SAF structure comprises a non-magnetic layer and two ferromagnetic layers that sandwich the non-magnetic layer to be anti-ferromagnetic coupled with each other.

Figure 1:
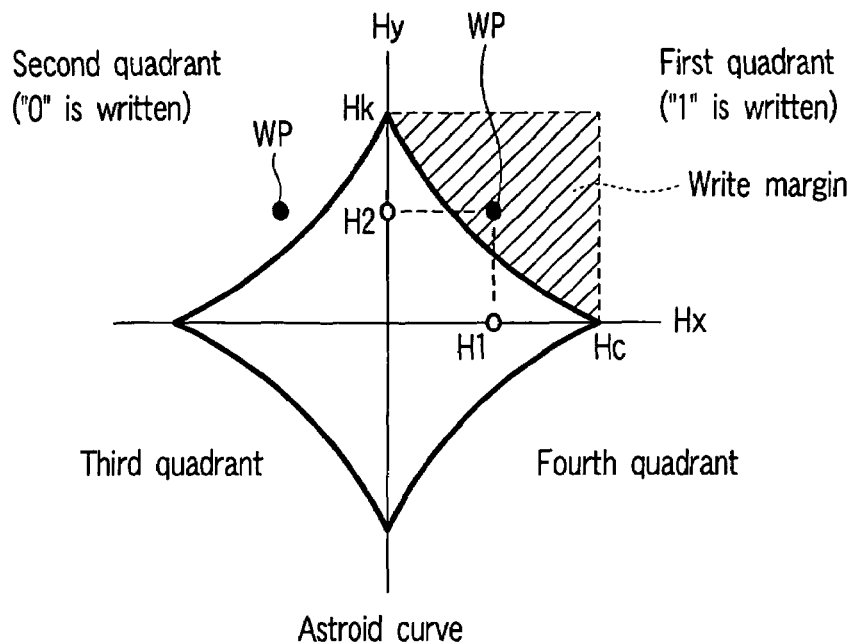
FIG. 1 is a view showing an astroid curve as a reference example.

In general, an astroid characteristic of a magneto-resistive element has such a shape that an astroid curve closes on an easy-magnetization axis (Hx axis) and a hard-magnetization axis (Hy axis) as shown in, for example, FIG. 1. That is, a half-selected cell to which only a magnetic field in the direction of easy magnetization or hard magnetization is applied fails if an intensity of the magnetic field excess that of each of switching magnetic fields Hc (coercive force) or Hk.

The direction of the easy magnetization is defined as the direction in which the magnetic moment of the ferromagnet is the easiest to point.

The direction of the hard magnetization is defined as the direction in which the magnetic moment of the ferromagnet is the hardest to point.

If two quadrants of the astroid characteristics are utilized, data is written by, for example, utilizing first and second quadrants.

If the astroid curve is recessed more in a quadrant for use in data writing, a write margin as a switching (magnetization direction reversal)-enabled region can be made larger. At the same time, it is possible to reduce writing magnetic fields in the direction of easy magnetization, H1, and in the direction of hard magnetization, H2, and to bring a write point WP close to an origin.

Figure 2:
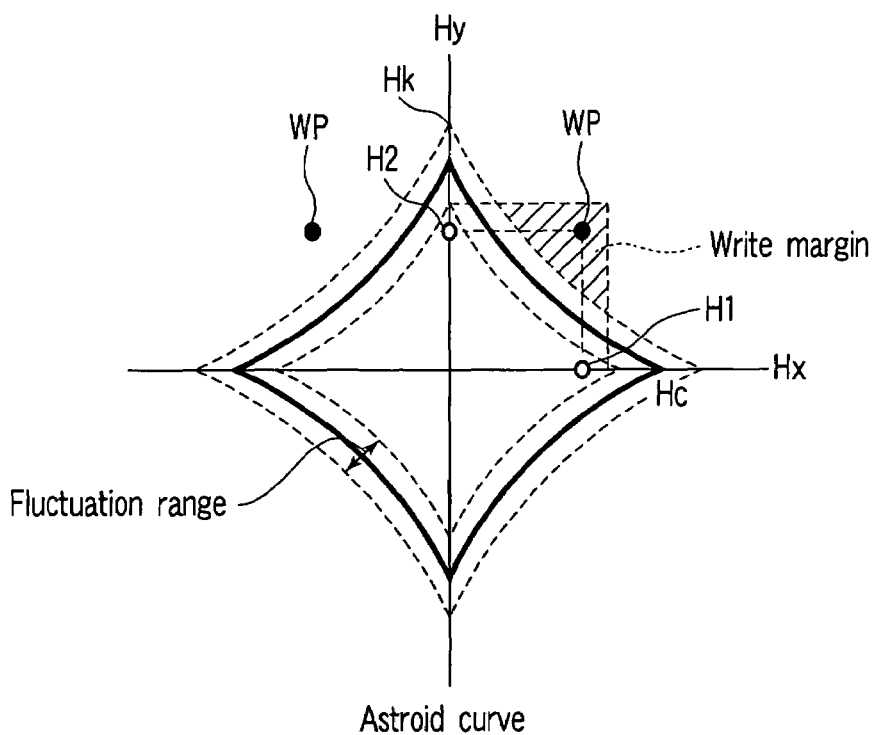
FIG. 2 is a view showing an astroid curve as another reference example.

However, many magneto-resistive elements configuring a memory cell array have dispersion of astroid shape, as shown in FIG. 2, for a reason of a wafer process. In this case, a write margin is decreased to prevent miswriting to a non-selected cell or a half-selected cell.

Figure 3:
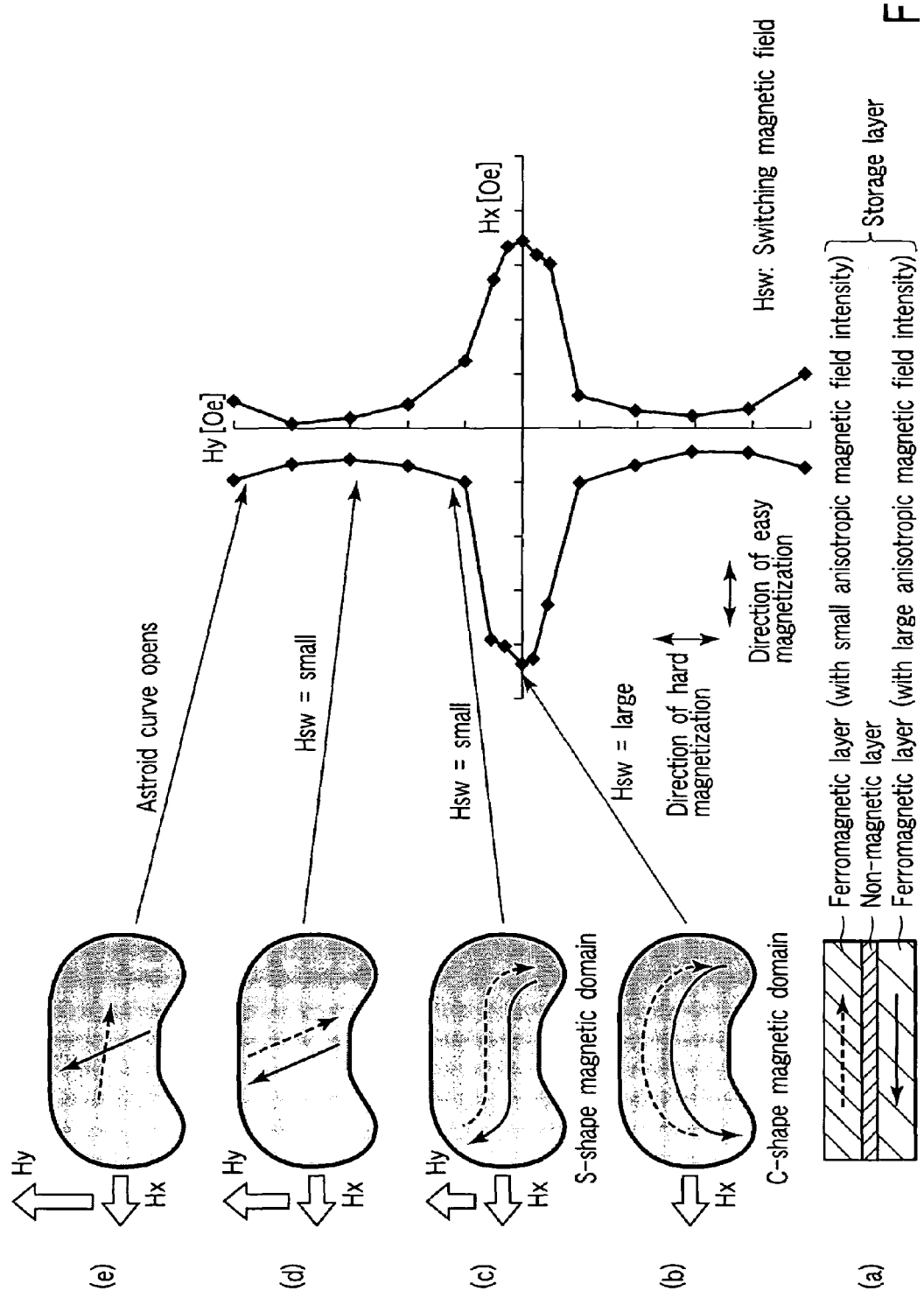
FIG. 3 is a view showing an astroid curve according to an example of the present invention.

In contrast, according to the embodiment of the present invention, the intensity of exchange coupling between the two ferromagnetic layers of the SAF structure is adjusted, whereby it is possible to realize astroid characteristics having such a shape that an astroid curve does not close on the hard-magnetization axis (Hy axis) and opens in the direction of hard magnetization as shown in, for example, FIG. 3.

And the astroid curve in a direction of hard magnetization goes through a local minimum point in process of an increase of a magnetic field in the direction of hard magnetization.

Specifically, exchange coupling between the two ferromagnetic layers configuring the SAF structure is weakened. The intensity of exchange coupling between the two ferromagnetic layers depends on the thickness of the non-magnetic layer interposed between the two ferromagnetic layers as shown in, for example, FIG. 4. Therefore, in the embodiment of the invention, the thickness of the non-magnetic layer (e.g., Ru) configuring the SAF structure is set to larger than 1 nm (typical value is 2 nm), thereby realizing astroid characteristics that its astroid curve does not close on the hard-magnetization axis.

In this case, when a magnetic field is applied only in the direction of hard magnetization, switching (magnetization direction reversal) will not occur regardless of an intensity value of the magnetic field. Consequently, it is possible to improve robustness against write disturbance, thereby ensuring a large write margin.

On the other hand, consideration is made for a case where a magnetic field is applied only in the direction of easy magnetization. In this case, if a magneto-resistive element is used which has a free layer having a planar shape asymmetrical about an easy axis such as that of a C-shape or a trapezoid, it is possible to increase a value of a switching magnetic field intensity (coercive force) Hc on the Hx axis of the astroid curve. If such a shape is employed, a C-type magnetic domain is configured when a magnetic field is applied only in the direction of easy magnetization (in the case of a half-selected cell). Since the C-type magnetic domain is difficult to reverse its magnetization direction, the switching magnetic field intensity (coercive force) increases.

Besides, by employing a shape that has two-fold rotational symmetry and does not have mirror symmetry about an easy axis and a hard axis, the value of the switching magnetic field intensity (coercive force) Hc can be increased.

To have two-fold rotational symmetry means that if the magneto-resistive element is rotated clockwise or counter-clockwise by 360°/2 around a center point O of the magneto-resistive element, it agrees with the original shape. That is, two-fold rotational symmetry refers to point symmetry about the center point O of the magneto-resistive element.

Such a shape includes a parallelogram, a propeller shape, etc. We have invented a propeller shape. The propeller shape is parallelogram with arc-shape bulges. The two bulges are placed on both sides, in the middle of the longer length of the parallelogram. The remanent magnetization state of the propeller shape is an S-type magnetic domain. If a magnetic field is applied only in the direction of easy magnetization (in the case of a half-selected cell), two C-type magnetic domains are configured. Since the C-type magnetic domain is difficult to reverse its magnetization direction, the switching magnetic field intensity (coercive force) increases.

The most important factor to secure thermal stability of a magnetic random access memory is to improve thermal stability of a half-selected cell to which only either one of a magnetic field HWL which is applied to a free layer of a magneto-resistive element by a write current flowing through a word line (WL) and a magnetic field HBL which is applied to the free layer by a write current flowing through a bit line (BL) is applied.

The energy barrier ratio of WL half-selected cells is proportional to $(1-HWL/Hk)^2$ and the energy barrier ratio of BL half-selected cells is proportional to $(1-HBL/Hc)^2$.

Here, Hk is a value of a point where an astroid curve closes when an absolute value of a hard-axis magnetic field Hy is increased (and an absolute value of an easy-axis magnetic field Hx is decreased). Hc is a value of a point where the astroid curve closes when the absolute value of the easy-axis field Hx is increased (and the absolute value of the hard-axis field Hy is decreased).

Therefore, to improve the thermal stability, it is important to decrease both a value of a WPWL (word line directional write point)=HWL/Hk and a value of a WPBL (bit line directional write point)=HBL/Hc. For this purpose, a shape of the free layer must be devised so that the astroid curve is recessed more.

In the case of a magneto-resistive element according to the embodiment of the invention, Hk is infinitely great and HBL/Hc can be decreased by employing a C-shape, a parallelogram, a propeller shape, etc. as the shape of the free layer, so that the thermal stability can be improved.

Next, a relationship shown in FIG. 3 is described between astroid characteristics and a magnetization pattern of a free layer at the time of data writing.

A magneto-resistive element is supposed to be of a C-shape. Further, a non-magnetic layer configuring an SAF structure is made of Ru and has thickness of, for example, about 2 nm and set so that an intensity of exchange coupling between two ferromagnetic layers is weak.

As shown in FIGS. 3A to 3E, directions in which the two ferromagnetic layers configuring the SAF structure are each indicated by an arrow. Further, residual magnetization of the free layer of the magneto-resistive element is supposed to configure a C-type magnetic domain.

First, in a state in which mainly an easy-axis field Hx is applied as shown in FIG. 3B, a magnetization pattern of the free layer configures one C-type magnetic domain. As a result, a half-selected cell to which mainly an easy-axis field Hx is applied has a larger value of a switching magnetic field (reversed magnetic field) Hsw.

Next, in a state in which the easy-axis field Hx and a hard-axis field Hy are applied as shown in FIG. 3C, the magnetization pattern of the free layer configures an S-type magnetic domain. As a result, a selected cell to which data is written has a smaller value of the switching magnetic field (reversed magnetic field) Hsw, so that an astroid curve is recessed greatly.

Next, if the hard-axis field intensity Hy increases as shown in FIG. 3D, the free layer is magnetized roughly in the direction of hard magnetization. At this point, the two ferromagnetic layers are maintained as magnetized anti-parallel to each other.

To be anti-parallel as used herein refers to a state in which the two ferromagnetic layers are magnetized in mutually opposite directions.

Next, if the hard-axis field Hy is increased further as shown in FIG. 3E, the ferromagnetic layer having a smaller magnetic anisotropy field is magnetized more nearly in the direction of easy magnetization than the ferromagnetic layer having a larger anisotropy field. Accordingly, anti-parallelism cannot be maintained in magnetization direction between the two ferromagnetic layers, so that the astroid curve opens in the direction of hard magnetization.

It is to be noted that a magnitude of the magnetic anisotropy field is determined by a material or thickness of the ferromagnetic layer.

According to the embodiment of the invention, the astroid curve opens in the direction of hard magnetization, so that it is possible to prevent miswriting to a half-selected cell to which only a hard-axis magnetic field is applied, reduce the switching magnetic field, and improve thermal stability.

Figure 4:
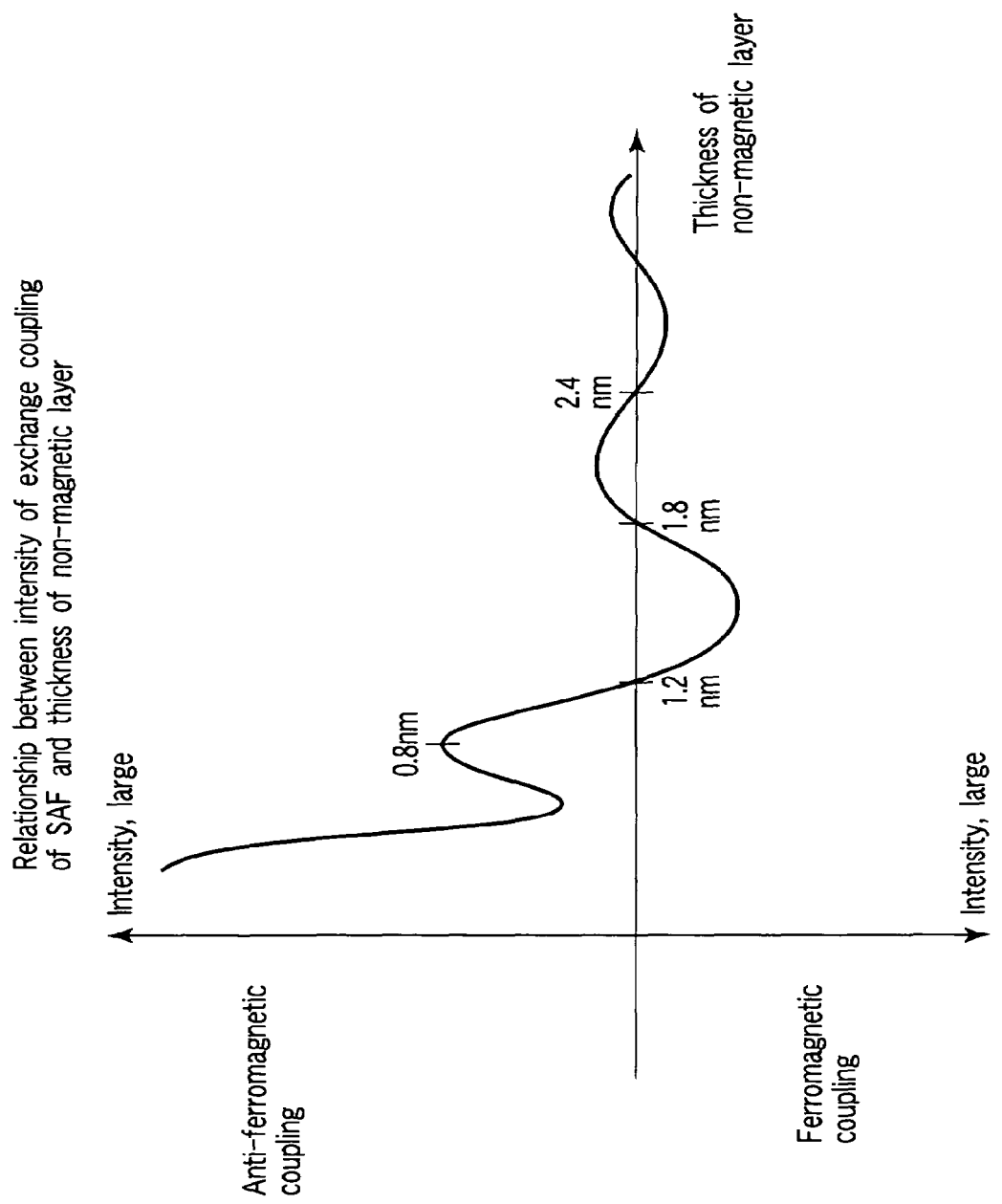
FIG. 4 is a view showing a relationship between an intensity of exchange coupling of an SAF and a thickness of a non-magnetic layer.

FIG. 4 shows a relationship between an intensity of exchange coupling of the SAF and a thickness of the non-magnetic layer.

Exchange coupling may come in anti-ferromagnetic coupling and ferromagnetic coupling. The former refers to a state in which two ferromagnetic layers are coupled with each other so as to be magnetized anti-parallel to each other and the latter refers to a state in which they are coupled with each other so as to be magnetized parallel to each other.

Since the type and the intensity of exchange coupling vary with the thickness of the non-magnetic layer, the thickness of the non-magnetic layer is set to such a value that the two ferromagnetic layers are anti-ferromagnetic-coupled with each other, for example, 0.7 nm or more, and preferably a value in a range not less than 1 nm and not larger than 5 nm.

By thus setting the thickness, it is possible to realize such astroid characteristics that an astroid curve opens in the direction of hard magnetization.

If the thickness of the non-magnetic layer is less than 0.7 nm, the intensity of exchange coupling between the two ferromagnetic layers increases, so that the astroid curve closes on the hard axis.

Figure 5:
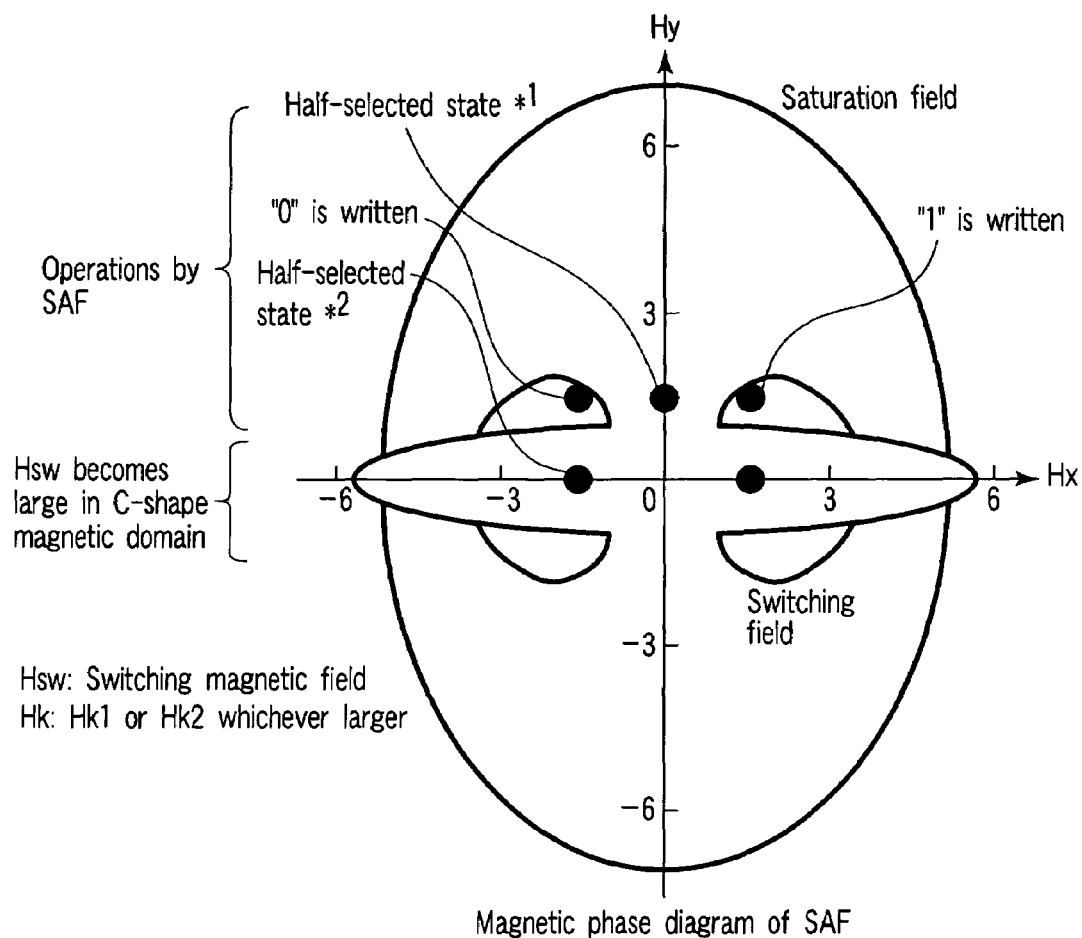
FIG. 5 shows a magnetic phase diagram of the SAF.

FIG. 5 shows a magnetic phase diagram of a magneto-resistive element having an SAF structure. FIG. 5 shows a case where hj=2.1, t2=0.5·t1, and Ms2=Ms1. Here, hj is a parameter that indicates an intensity of coupling, J indicates coupling energy of an SAF structure, Ms1 and Ms2 each indicate a magnetization of each ferromagnetic layer, and Hk1 and Hk2 each indicate a magnetic anisotropy field of the each layer. Here and after, Ms1×t1 is assumed to be larger than Ms2×t2. A relationship between hj and J is given by the following equation by using a parameter of the thicker ferromagnetic layer.

$$J = hj \cdot Hk1 \cdot Ms1 \cdot t1$$

A SAF structure of hj=2.1 has much weaker exchange coupling than a SAF structure used in an MTJ pinned layer. It is a little weaker in exchange coupling even than a SAF structure used in a toggle-mode free layer.

In the magnetic phase diagram, a periphery is surrounded by a saturation field.

Figure 6:
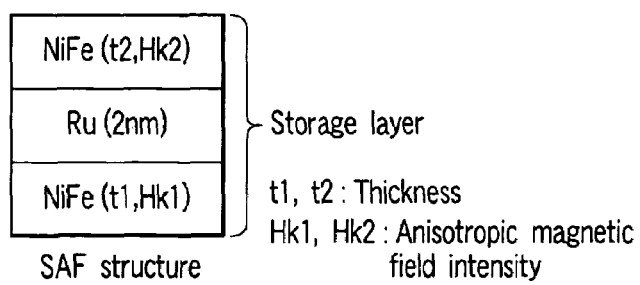
FIG. 6 is a view showing a structure of a free layer related to the magnetic phase diagram of FIG. 5.

It is to be noted that a free layer of a magneto-resistive element has such a structure as shown in, for example, FIG. 6. A typical example may be made of NiFe with a thickness of t1, NiFe with a thickness of t2, and Ru (with a thickness of 2 nm) interposed between them.

In the vicinity of the easy-axis (Hx axis), the free layer of the magneto-resistive element configures at least one C-type magnetic domain, and therefore, the switching magnetic field is large. That is, since the magnetization direction of the magneto-resistive element is not reversed only by applying an easy-axis magnetic field, data stored in a half-selected cell is not lost.

No matter how large hard-axis magnetic field (Hy) is applied, the magnetization direction of the magneto-resistive element is not reversed as far as the magnetic field does not exceed the saturation field. That is, since the magnetization direction of the magneto-resistive element is not reversed either only by applying a hard-axis magnetic field, the data stored in the half-selected cell is not lost.

Conditions for obtaining an astroid curve that opens in the direction of hard magnetization as shown in FIG. 3 are given by the parameters of t1, t2, Hk1, Hk2, Ms1, Ms2, and J which configure the SAF structure.

Figure 7:
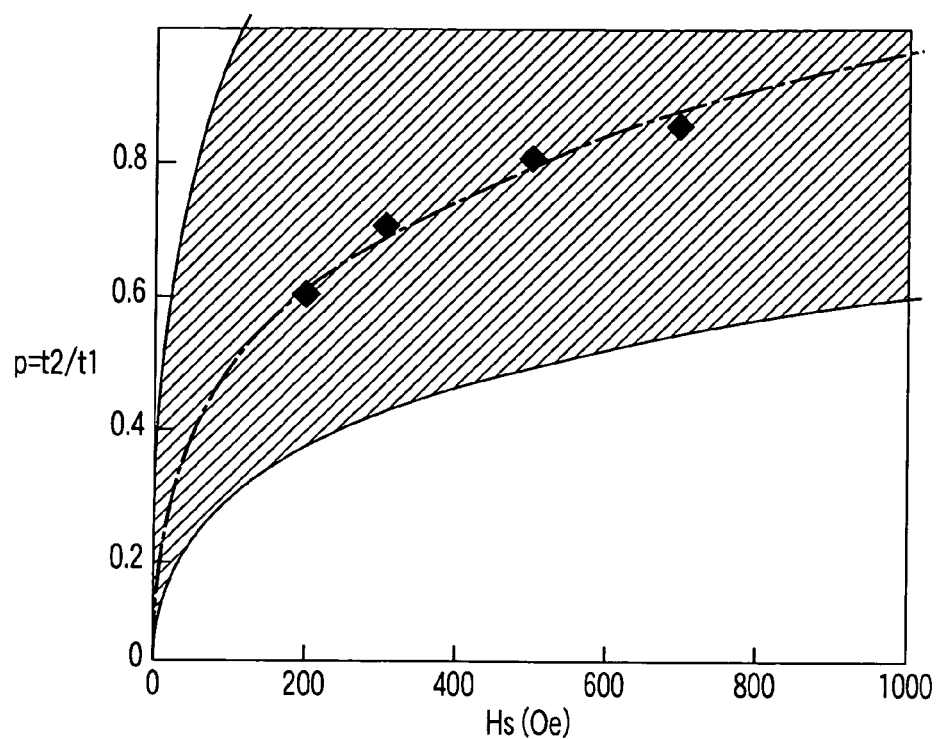
FIG. 7 is a view showing a relationship between Hs and p.

For example, if Ms1=Ms2=Ms, the conditions are given in a hatched portion in FIG. 7 by parameters of t2/t1 and Hs=J (t1+t2)/(Ms·t1·t2). That is, by designing t2/t1 and Hs by using a value that corresponds to the hatched portion in FIG. 7, it is possible to obtain an astroid curve that opens in the direction of hard magnetization.

t2/t1 is desirably not less than 0.1 and not more than 0.9. Hs is desirably not less than 20 Oe and not more than 800 Oe. hj is desirably not less than 0.6 and not more than 80. In these ranges, generally, as t2/t1 increases, optimal values of Hs and hj increase.

Figure 8:
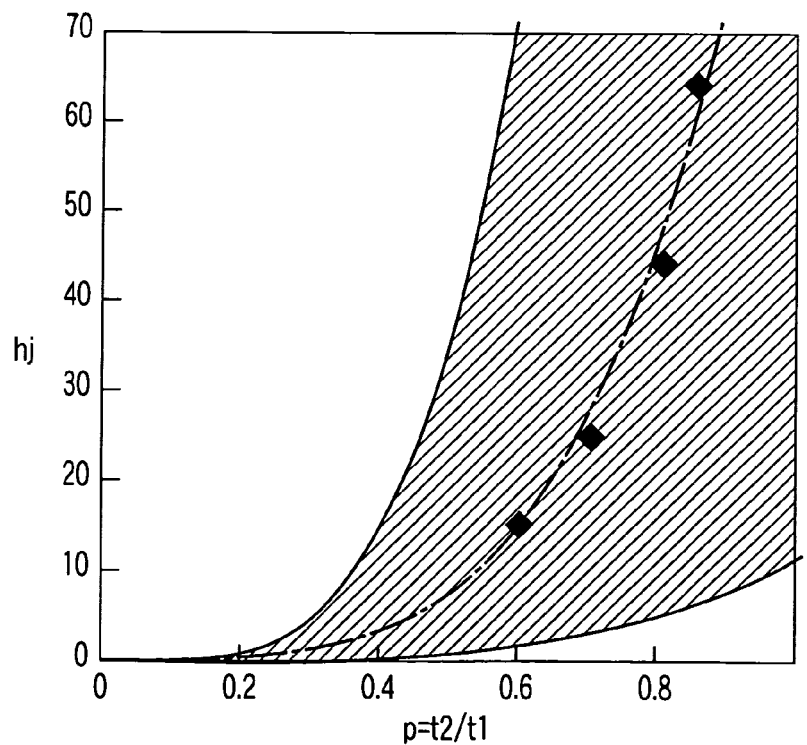
FIG. 8 is a view showing a relationship between p and hj.

FIG. 8 shows an optimal range of hj as a function of p=t2/t1. A hatched portion indicates the optimal range.

They may be roughly expressed in the following general equations:

$$hj \geq 12p^4 \quad \text{Equation (1), and}$$

$$hj \leq 580p^4 \quad \text{Equation (2)}$$

In comparison to toggle mode, data writing by use of the SAF structure according to the embodiment of the invention enables data to be written by using a magnetic field intensity not more than a half of that required in toggle mode.

Therefore, the SAF structure according to the embodiment of the invention is superior to the toggle mode in terms of reduction in write current and power dissipation.

Next, an energy barrier for magnetization reversal of WL half-selected cell is described.

Figures 9A, 9B:
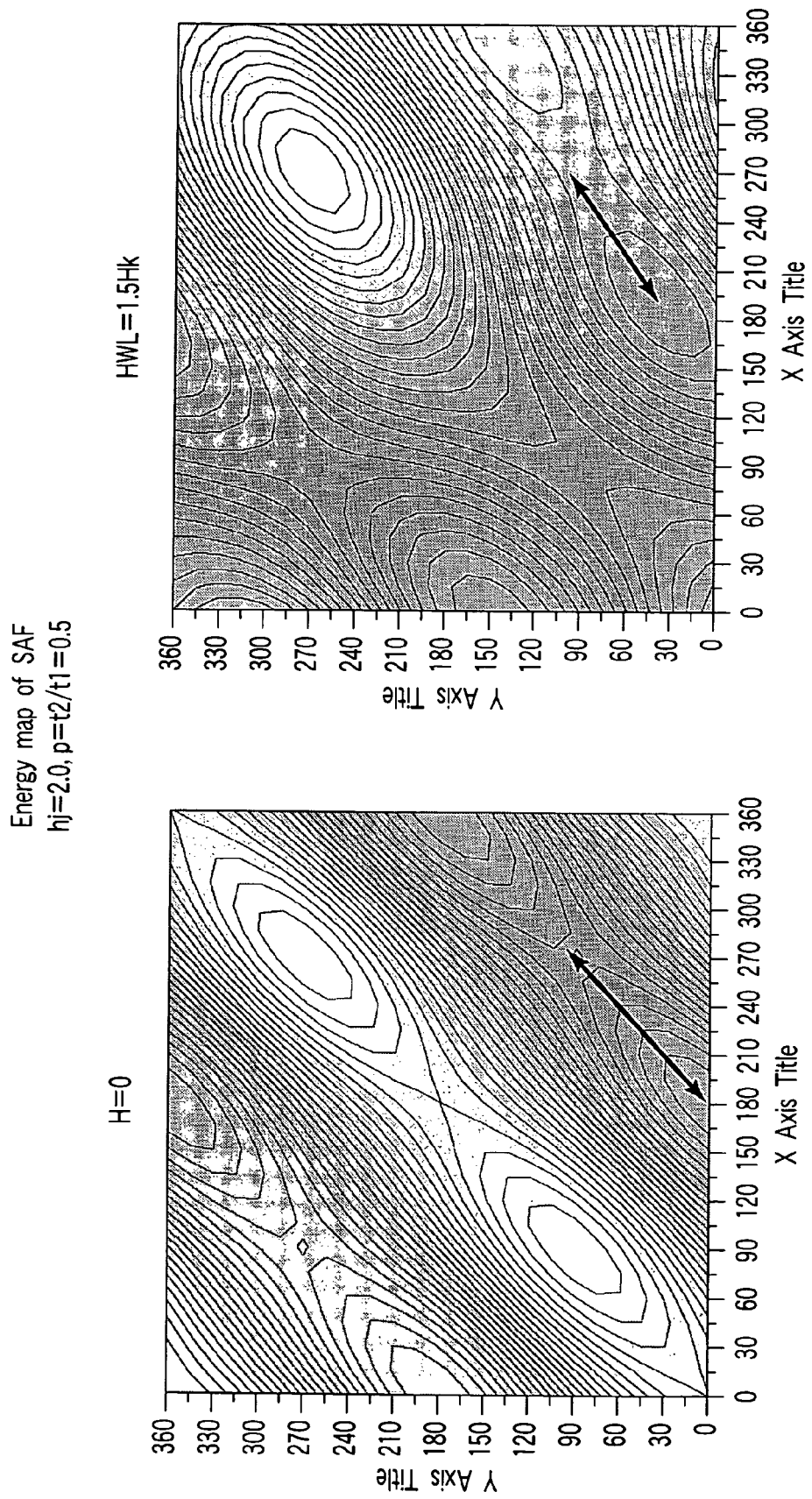
FIGS. 9A and 9B are views each showing an energy map of the free layer as a SAF.

FIGS. 9A and 9B show examples of an energy map of a free layer of a magneto-resistive element. The free layer has such a structure as shown in FIG. 6, where hj=2.0 and t2/t1=0.5 are assumed.

A horizontal axis gives an angle between a magnetization direction of one of the two ferromagnetic layers (NiFe) configuring the SAF structure and an easy axis, and a vertical axis gives an angle between a magnetization direction of the other of the two ferromagnetic layers (NiFe) and the easy axis.

The energy barrier corresponds to a difference in energy level between two ends of an arrow in each of FIGS. 9A and 9B. Generally, as compared to the case of a zero-magnetic field of FIG. 9A, an energy barrier decreases in a magnetic field of FIG. 9B.

A value of writing magnetic field HWL is set to, for example, 1.5 Hk. It is to be noted that Hk is larger one of values of magnetic anisotropy field of the two ferromagnetic layers configuring the SAF structure free layer.

In such a WL half-selected state, the energy barrier when hj=2.0 is decreased to about 0.60 of that (FIG. 9A) when the magnetic field intensity is zero. A degree of this decrease is slight as compared to a case where the free layer is composed of only one ferromagnetic layer. This degree of decrease corresponds to write point WPWL=0.23 in the case where the free layer is composed of only one ferromagnetic layer.

Further, when hj=1.5, the energy barrier required for switching is decreased to about 0.72 of that when the magnetic field intensity is zero. This degree of decrease corresponds to write point WPWL=0.15'th time that of the case where the free layer is composed of only one ferromagnetic layer.

In a case where the free layer is composed of only one ferromagnetic layer, it is difficult to recess the astroid curve so that WPWL is decreased to 0.15 to 0.23. In the present invention, a decrease in energy barrier in the half-selected state is suppressed by optimizing the intensity of exchange coupling according to a film thickness ratio of the two ferromagnetic layers of the SAF structure.

Figure 10:
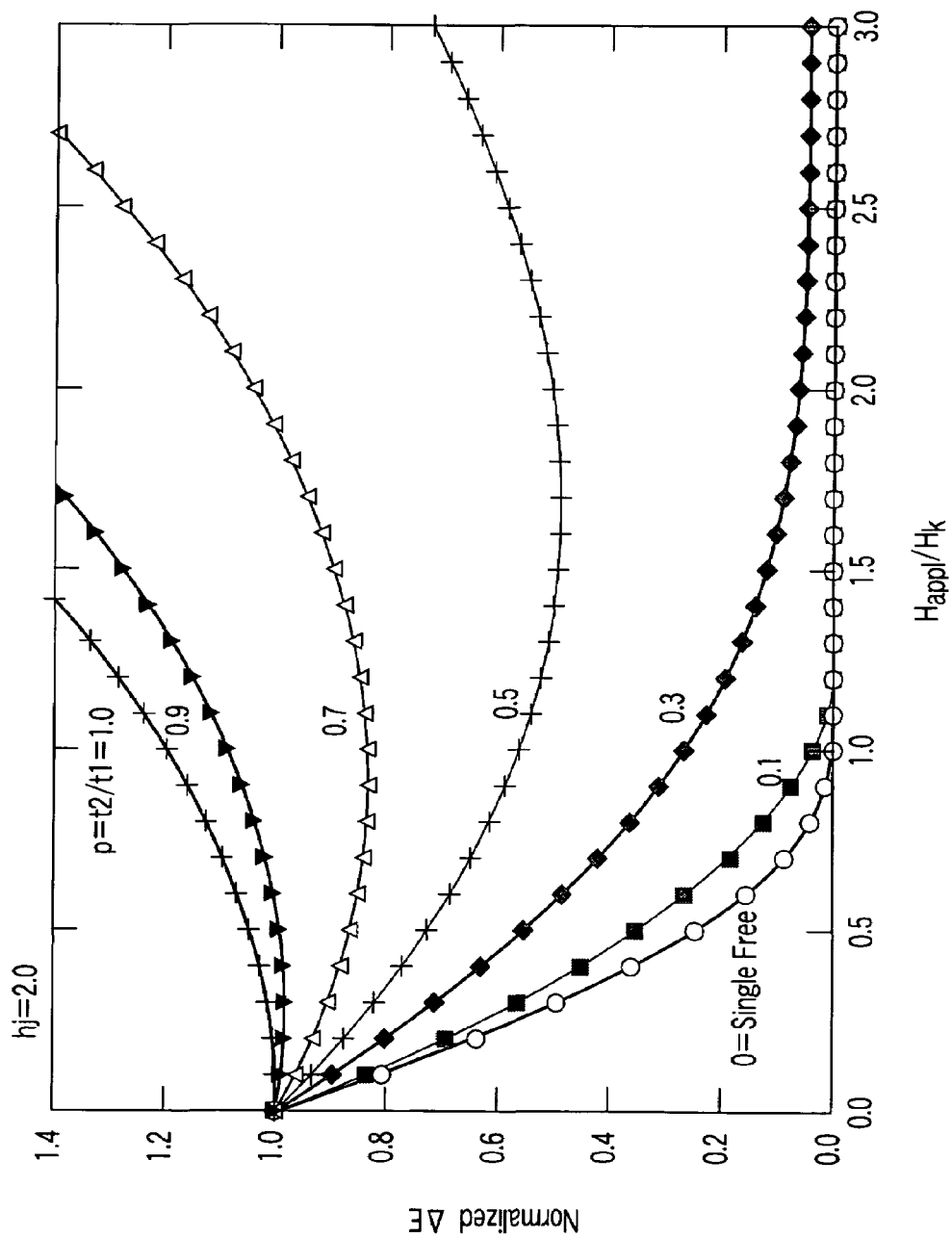
FIG. 10 is a view showing an external magnetic field-dependency of an energy barrier.

FIG. 10 further shows an example where an external magnetic field-dependency of an energy barrier, ΔE, is calculated by using p=t2/t1 as a parameter.

In this case, calculation was performed in the case of hj=2.0. A horizontal axis gives a value of an external magnetic field intensity Happl normalized by using Hk, and a vertical axis gives a value of ΔE normalized by using a zero-external magnetic field value ($\Delta E_0$).

As shown in FIG. 10, the energy barrier in the SAF free layer is not decreased so much when an external magnetic field is applied as compared to the case of a single free layer with p=0. If p is not more than 0.3, the energy barrier level decreases remarkably, and therefore, preferably p exceeds 0.3. Further, p is preferably not less than 0.5, since a minimal value of $\Delta E/\Delta E_0$ is not less than 0.5. However, an optimal value range of p varies with hj.

Figure 11:
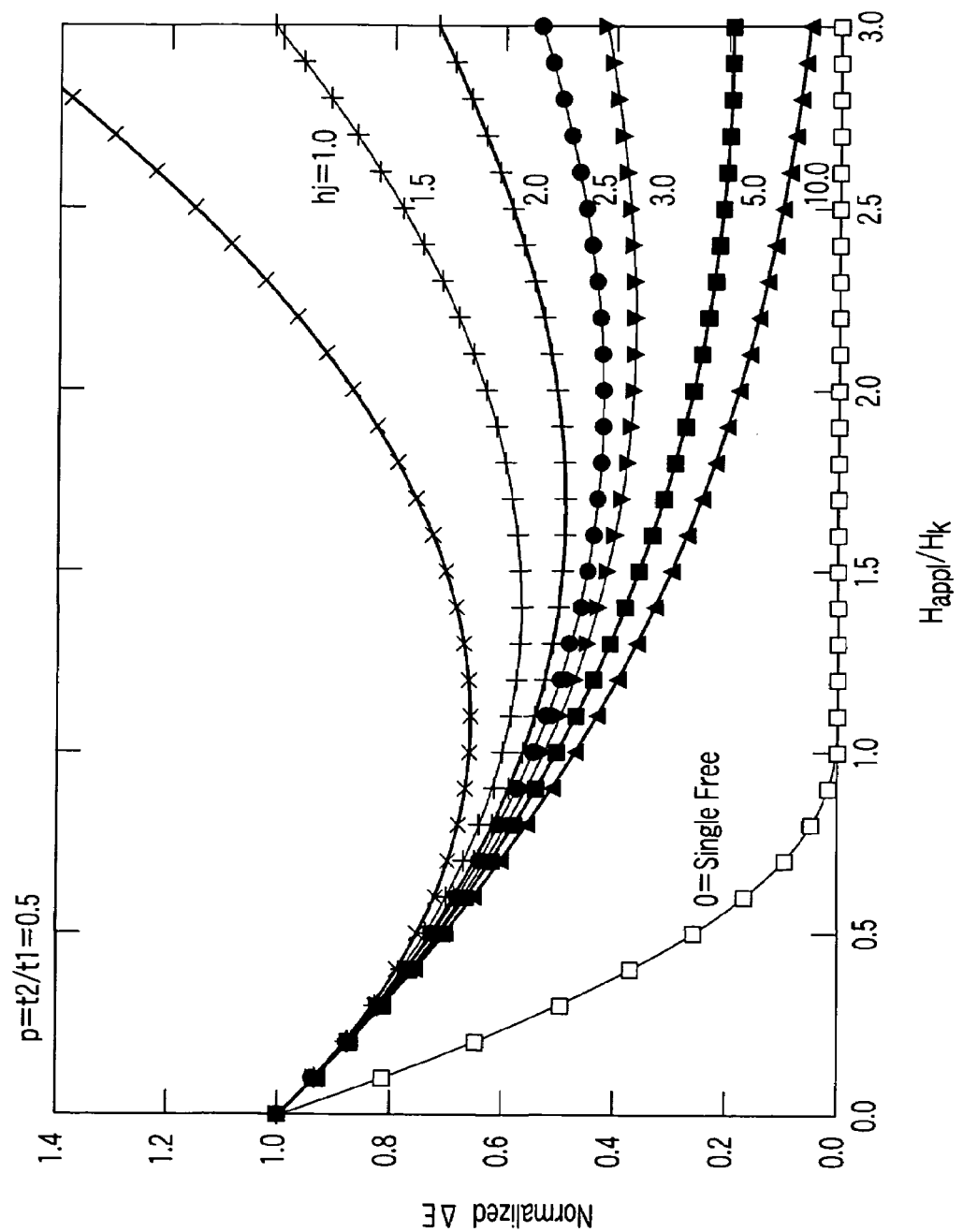
FIG. 11 is a view showing another external magnetic field-dependency of the energy barrier.

FIG. 11 shows an example where an external magnetic field-dependency of an energy barrier, ΔE, is calculated by using hj as a parameter.

In this case, calculation was performed in the case of p=t2/t1=0.5. A horizontal axis gives a value of an external magnetic field Happl normalized by using Hk, and a vertical axis gives a value of ΔE normalized by using a zero-external magnetic field intensity.

In a case where p=t2/t1=0.5, the energy barrier decreases remarkably if hj exceeds 10. Therefore, hj is preferably not more than 10. Further, if hj is set to 2 or less, preferably a minimal value of $\Delta E/\Delta E_0$ is not less than 0.5. However, an optimal value range of hj varies with p.

Figure 12:
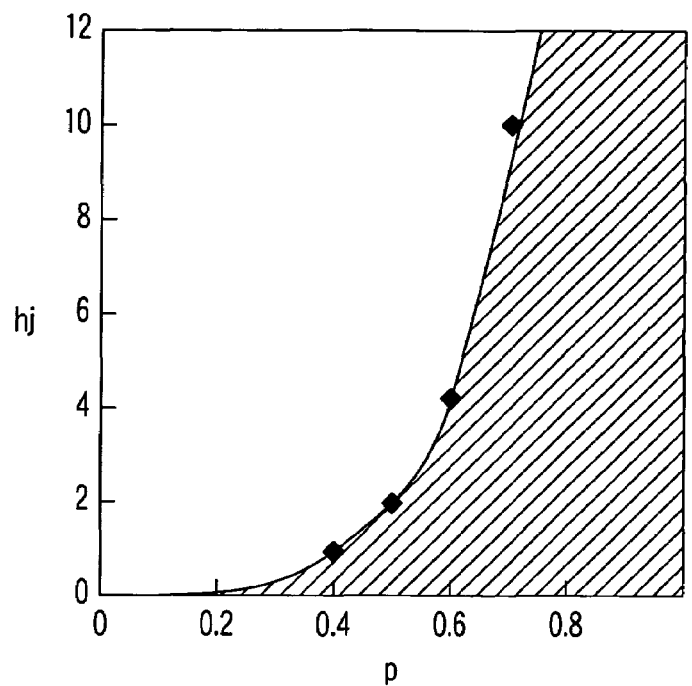
FIG. 12 is a view showing an optimal range of hj as a function of p.
Figure 13:
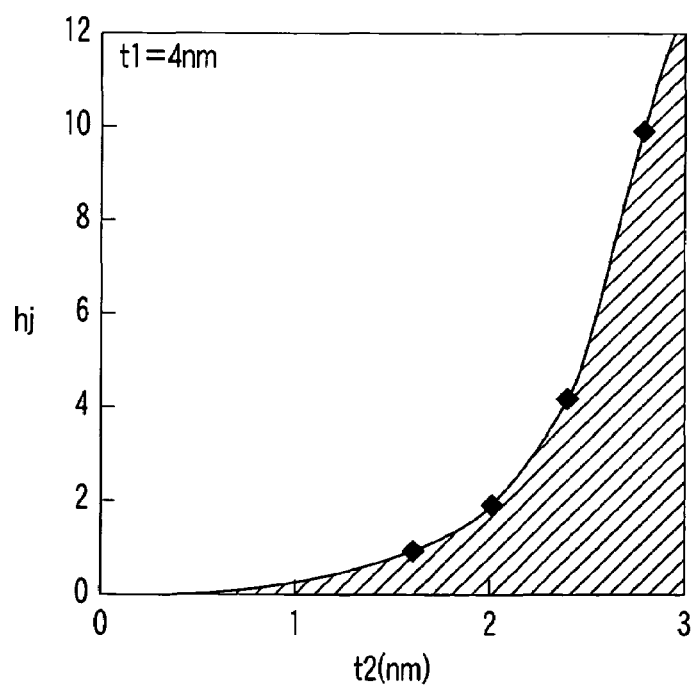
FIG. 13 is a view showing an optimal range of hj as a function of t2.

FIG. 12 shows the optimal range of hj as a function of p. A shaded area is the optimal range. Further, FIG. 13 shows the optimal range of hj as a function of t2 in a case where t1=4 nm. A shaded area is the optimal range.

This may be roughly given in the following general equation:

$$hj \leq 40p^4 \qquad \text{Equation (3)}$$

As described above, according to the embodiment of the invention, an energy barrier of a half-selected cell can be increased, thereby providing a magneto-resistive element excellent in thermal stability.

The above-described Equations (1) and (2) for giving conditions to obtain an astroid curve that opens in the direction of hard magnetization and Equation (3) for giving conditions to provide a percentage of decrease in energy barrier level at the time of half-selection of 50% can be combined to provide the following equation that gives an optimal range in the present invention.

$$12p^4 \leq hj \leq 40p^4 \qquad \text{Equation (4)}$$

Taking stability and reproducibility of characteristics of a material of the free layer into account, p has a proper range. If p is small in value, there occurs a problem that the thinner ferromagnetic layer becomes too thinner to provide a continuous layer or a problem that the characteristics become unstable due to diffusion through the upper and lower layers.

Therefore, p is preferably 0.05 or more. More preferably, p is 0.1 or more. A total value of Hk due to anisotropy of the material of the SAF structure is generally proportional to a (film thickness sum)/(film thickness difference). If the film thickness difference is small, Hk varies greatly with the film thickness dispersion.

Therefore, from a viewpoint of suppressing the switching field dispersion, p is preferably not close in value to 1 so much. That is, p is preferably 0.95 or less. More preferably, p is 0.9 or less. Taking these conditions of p and Equations (3) and (4) into account, hj is preferably 33 or less. More preferably, hj is 27 or less.

2. Planar Shape of Free Layer of Magneto-Resistive Element

To maximize effects of the embodiment of the invention, it is preferable that the free layer has a planar shape that is asymmetrical about a centerline extending in the direction of easy magnetization.

Figure 14:
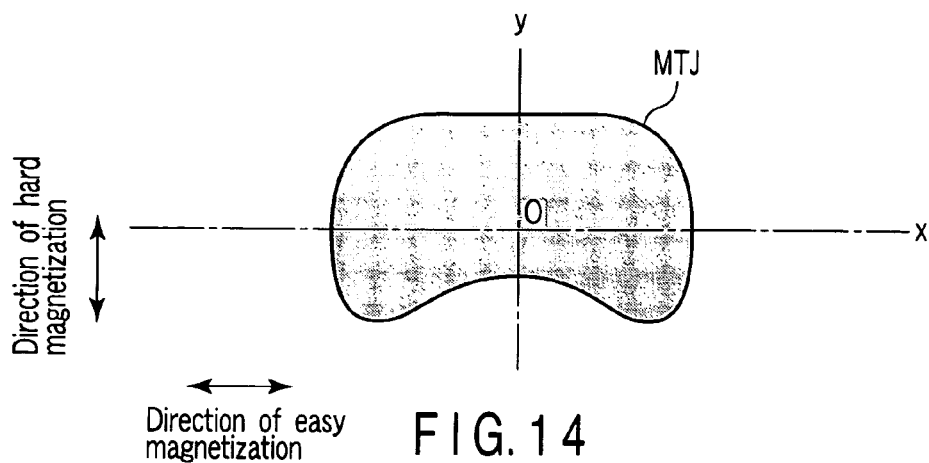
FIG. 14 is a view showing a C-shape magneto-resistive element.

For example, a magneto-resistive element MTJ of FIG. 14 has a C-planar shape. C-shape is asymmetrical about the centerline extending in the direction of easy magnetization.

Further, the effects of the embodiment of the invention can be maximized also by employing a planar shape of the free layer that has two-fold rotational symmetry and does not have mirror-symmetry about the centerline extending in the direction of easy magnetization and the centerline extending in the direction of hard magnetization.

Figure 15:
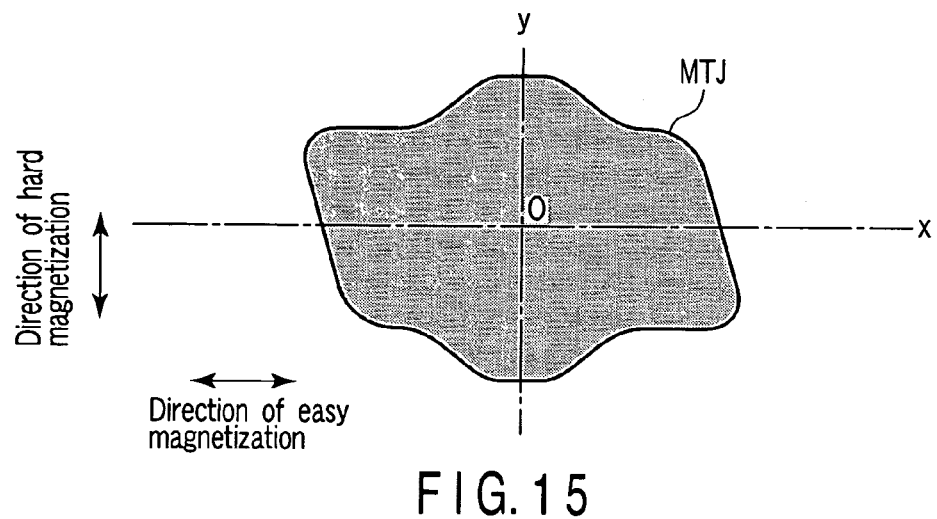
FIG. 15 is a view showing a propeller shape magneto-resistive element.
Figure 16:
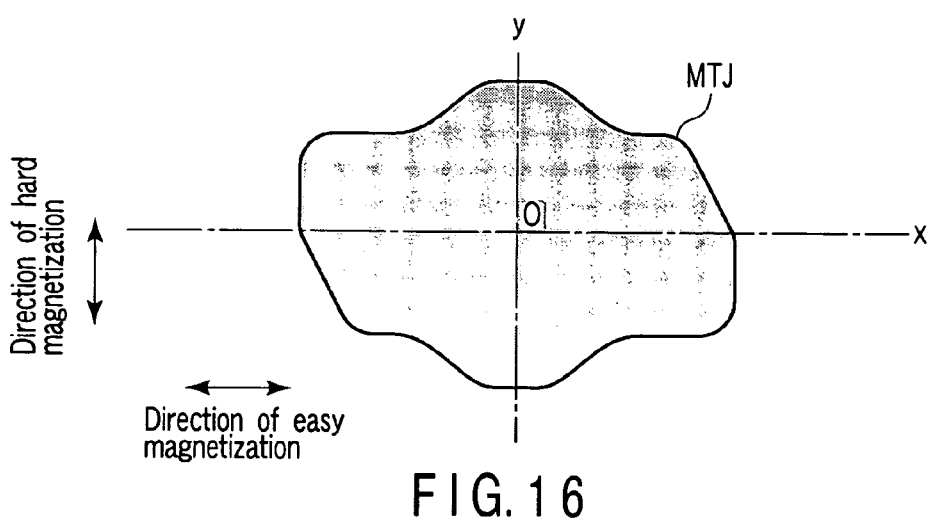
FIG. 16 is a view showing another propeller shape magneto-resistive element.

For example, a magneto-resistive element MTJ of FIG. 15 and that of FIG. 16 both are a propeller planar shape. Propeller shape has two-fold symmetry and does not have mirror-symmetry about the centerline extending in the direction of easy magnetization and the centerline extending in the direction of hard magnetization.

In the case of propeller shape, the astroid curve is not mirror-symmetrical about the centerline extending in the direction of hard magnetization. For example, a recess of the astroid curve is larger in the first and third quadrants than in the second and fourth quadrants. In such a case, the first and third quadrants are used to write data.

For example, the first quadrant of the astroid curve is used to write "1" and its third quadrant is used to write "0". In this case, a direction of a write current flowing through a word line and a bit lines when "1" is written is opposite to that of a write current flowing through the word line and the bit line when "0" is written.

There are some cases where the curve is recessed greatly in the second and fourth quadrants more than in the first and third quadrants. In such a case, the second and fourth quadrants are used to write data.

Figure 17:
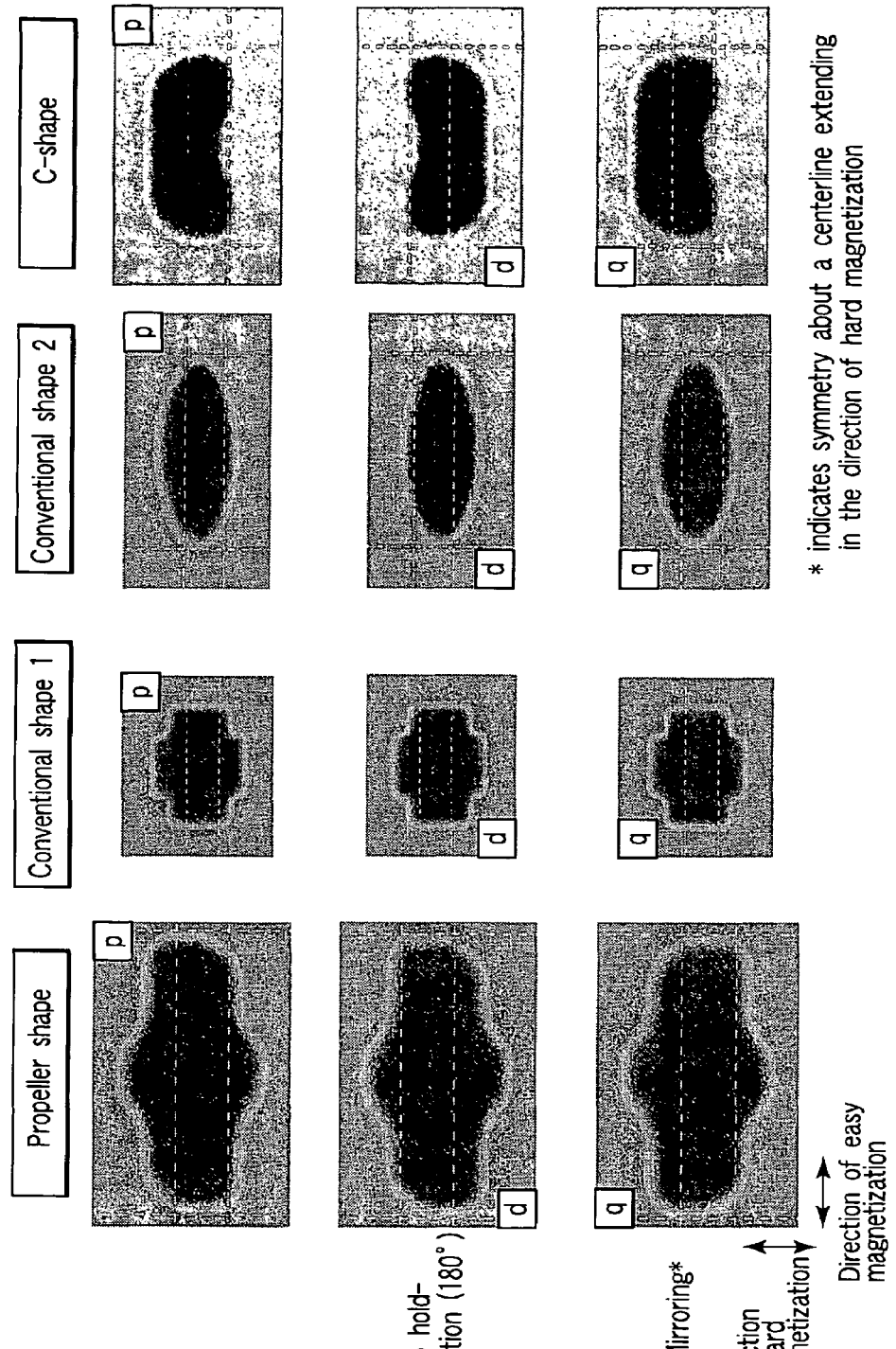
FIG. 17 shows, a propeller shape, conventional shape and C-shape elements in comparison to one another.

FIG. 17 shows a propeller shape, a conventional shape, and a C-shape in comparison to each other.

As the conventional shapes, two shapes of a cross shape (conventional shape 1) and an ellipsoid shape (conventional shape 2) are given here.

A cross shape and ellipsoid have two-fold rotational symmetry and are mirror-symmetrical about the centerline extending in the direction of easy magnetization and the centerline extending in the direction of hard magnetization.

A C-shape is asymmetrical about the centerline extending in the direction of easy magnetization.

A propeller shape has two-fold rotational symmetry and is not mirror-symmetrical about the centerline extending in the direction of easy magnetization and the centerline extending in the direction of hard magnetization.

3. Embodiments

The following will describe embodiments considered to be the most preferable.

(1) Memory Array Structure

Figure 18:
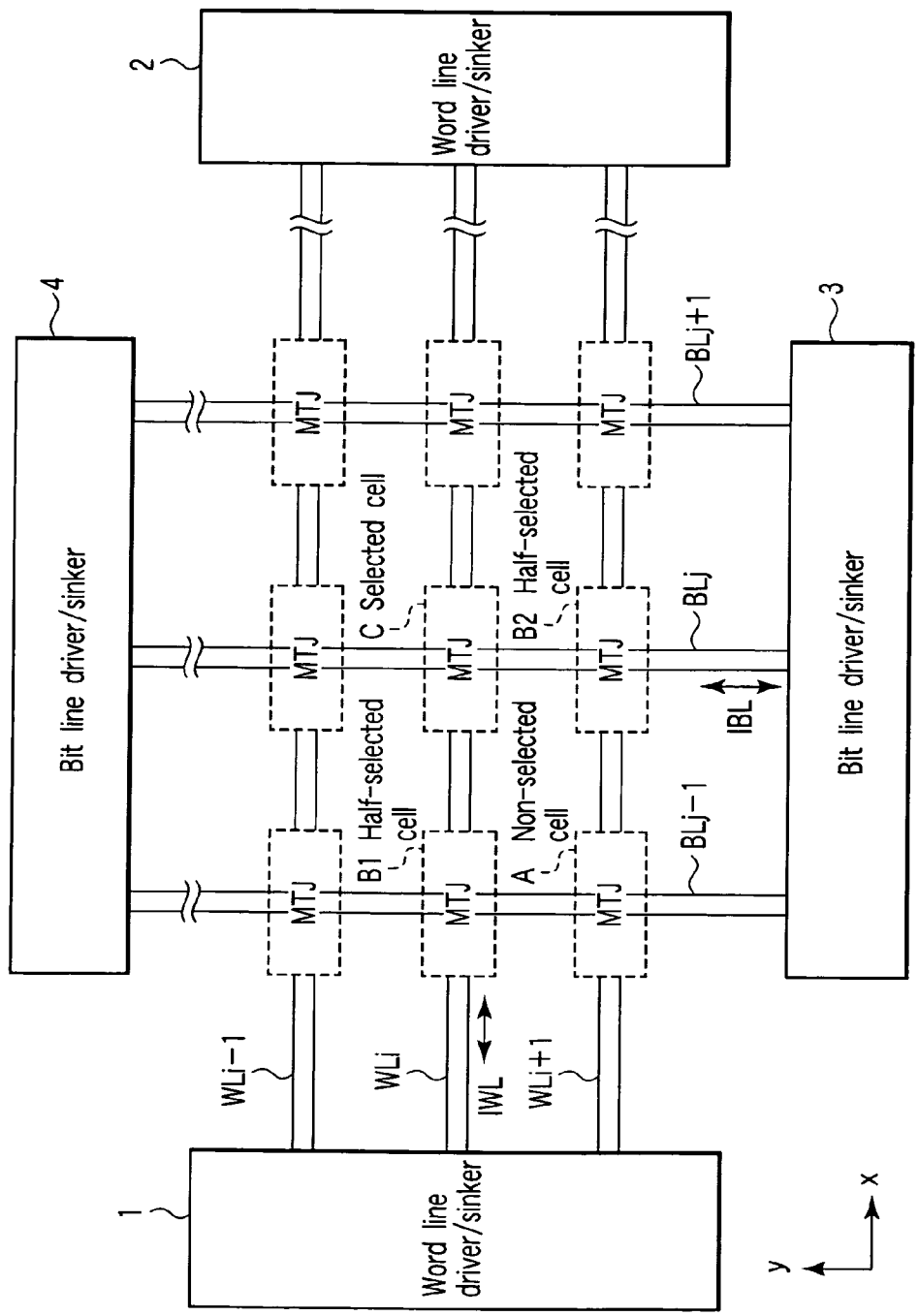
FIG. 18 is a diagram showing an example of a memory cell array of a magnetic random access memory.

FIG. 18 shows a memory cell array of a magnetic random access memory.

A memory cell is composed of magneto-resistive elements MTJ. The magneto-resistive elements MTJ are arranged in an array. The magneto-resistive element MTJ has, for example, a C-shape that is asymmetrical about a centerline extending in the direction of easy magnetization and symmetrical about a centerline extending in the direction of hard magnetization.

Below the magneto-resistive elements MTJ, word lines WLj−1, WLi, WLi+1 are arranged which extend in an x-direction. A word line driver/sinker 1 is connected to one end of each of the word lines WLi−1, WLi, and WLi+1, and a word line driver/sinker 2 is connected to the other end of each of the word lines.

In the case where data is written by using first and third quadrants of an astroid curve, a write current IWL is supplied to the word lines WLi−1, WLi, and WLi+1 in different directions according to a value of write data.

For example, when writing "1", a write current flows leftward from the word line driver/sinker 2 to the word line driver/sinker 1, and when writing "0", the write current flows rightward from the word line driver/sinker 1 to the word line driver/sinker 2.

In the case where data is written by using the first and second quadrants of the astroid curve, the write current IWL may be supplied to the word lines WLi−1, WLi, and WLi+1 in one direction (rightward) always. In this case, it is necessary only to replace the word line driver/sinker 1 with a word line driver 1 and the word line driver/sinker 2 with a word line sinker 2, so that a circuit configuration is simplified, thereby reducing a chip area advantageously.

Above the magneto-resistive elements MTJ, bit lines BLj−1, BLj, BLj+1 are arranged which extend in a y-direction. A bit line driver/sinker 3 is connected to one end of each of the bit lines BLj−1, BLj, and BLj+1, and a bit line driver/sinker 4 is connected to the other end of each of the bit lines.

A write current IBL is supplied to the bit lines BLj−1, BLj, and BLj+1 in different directions according to a value of write data.

For example, when writing "1", a write current flows downward from the bit line driver/sinker 4 to the bit line driver/sinker 3, and when writing "0", the write current flows upward from the bit line driver/sinker 3 to the bit line driver/sinker 4.

Although omitted in FIG. 18, a read circuit suitable for a type of the memory cell array is used to read data.

Figure 19:
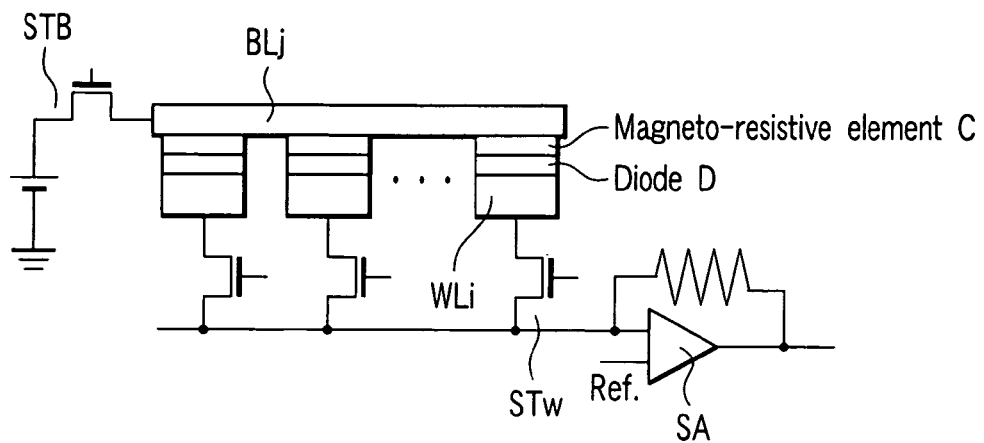
FIG. 19 is a diagram showing an example of a read circuit.

For example, as shown in FIG. 19, in the case of a cross-point type, a sense amplifier SA is connected to the word line WLi via a selector transistor STw, and a power source is connected to the bit line BLj via a selector transistor STB.

A diode D is arranged between a magneto-resistive element C and the word line WLi. The diode D has a function of preventing a sneak current, which is peculiar to the cross-point type, from flowing when data is read or written.

The sneak current is avoided by applying a bias potential to a non-selected word line WLi and a non-selected bit line BLj.

Figure 20:
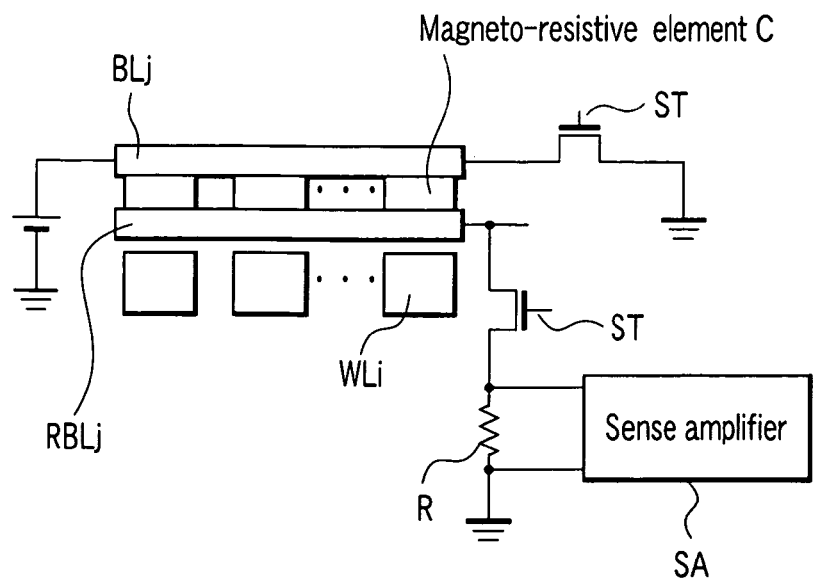
FIG. 20 is a diagram showing another example of the read circuit.

Further, as shown in FIG. 20, in the case of a ladder type, a resistor element R is connected to a read bit line RBLj via a selector transistor ST. The sense amplifier SA detects a voltage that occurs across the resistor element R to thereby sense read data. The power source is connected to one end of the bit line BLj, and a ground point is connected to the other end via, for example, the selector transistor ST.

Figure 21:
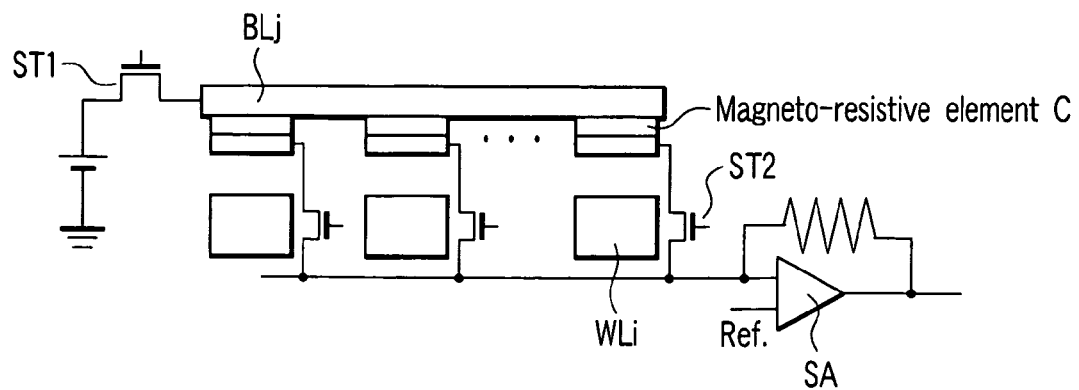
FIG. 21 is a diagram showing a further example of the read circuit.
Figure 22:
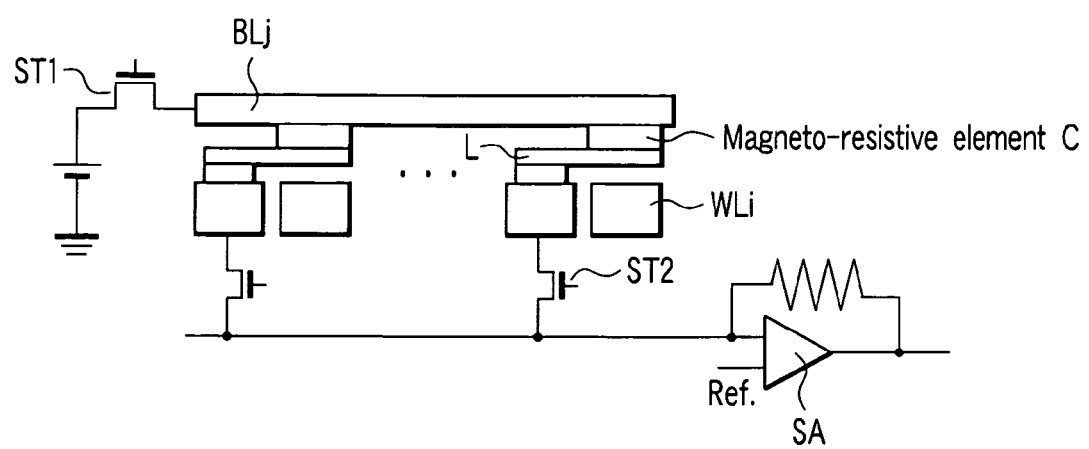
FIG. 22 is a diagram showing a still further example of the read circuit.

Furthermore, as shown in FIGS. 21 and 22, in the case of one-transistor/one-MTJ type, the sense amplifier SA is connected to one end of the magneto-resistive element C via a selector transistor ST2. The power source is connected to the bit line BLj via a selector transistor ST1.

It is to be noted that in a structure of FIG. 22, one end of the magneto-resistive element C is connected to a lower electrode L which serves as a leader line. Therefore, even if the selector transistor ST2 is arranged directly below the magneto-resistive element C, the word line WLi can be arranged in the vicinity of the magneto-resistive element C.

(2) Structure Examples of Magneto-Resistive Element

The following will describe structure examples of a magneto-resistive element.

A. STRUCTURE EXAMPLE 1

Structure example 1 relates to a magneto-resistive element having a C-planar shape and corresponds to a planar shape of FIG. 14. C-shape has all of its corners rounded off.

The magneto-resistive element is longer in the direction of easy magnetization and shorter in the direction of hard magnetization. A maximum value of a width (width in the direction of hard magnetization) of the magneto-resistive element is set to, for example, about 0.3 μm and a maximum value of a length (length in the direction of easy magnetization) of the magneto-resistive element is set to, for example, about 0.6 μm.

As another example, the maximum value of the width of the magneto-resistive element is set to, for example, about 0.2 μm, and the maximum value of the length of the magneto-resistive element is set to, for example, about 0.3 μm.

Although the width of the magneto-resistive element is not limited to these exemplary values, preferably it is 1 μm or less taking into account a growing integration density of the magneto-resistive elements.

In addition, the length of the magneto-resistive element is preferably set to 1 to 10 times its width, and more preferably, to 1.1 to 2.5 times its width.

B. STRUCTURE EXAMPLE 2

Structure example 2 relates to a magneto-resistive element having a propeller planar shape and corresponds to a planar shape of FIG. 15 or 16.

The propeller shape is composed of an extension and a protrusion. For example, in the case of the shape of FIG. 15, the extension has a parallelogram having a longer side in the direction of easy magnetization, and the protrusion protrudes from a longer side of the parallelogram in the direction of hard magnetization.

Further, in the case of the shape of FIG. 16, the extension has a rectangle longer in the direction of easy magnetization, and the protrusion protrudes from the longer side of the rectangle in the direction of hard magnetization. In addition, a corner that is present on at least one of two diagonals of the rectangle is cut off.

The propeller shape has all of its corners rounded off.

The magneto-resistive element is longer in the direction of easy magnetization and shorter in the direction of hard magnetization. The width (hard-axis width) of the magneto-resistive element is set to, for example, about 0.5 μm at its midsection and about 0.35 μm at the edge. The length of the magneto-resistive element is set to, for example, about 0.8 μm.

As another example, the width of the magneto-resistive element is set to, for example, about 0.2 μm at its midsection and about 0.13 μm at the edge. The length of the magneto-resistive element is set to, for example, about 0.4 μm.

Although the width of the magneto-resistive element is not limited to these exemplary values, preferably it is 1 μm or less taking into account a growing integration density of the magneto-resistive elements.

Preferably, the length of the magneto-resistive element is a value from 1 to 10 times its width, and more preferably, 1.1 to 2.5 times its width.

A length (hard-axis length) of the protrusion of the magneto-resistive element is set to a value not less than $\frac{1}{7}$ and not more than $\frac{1}{4}$ of the maximum value of the width of the extension of the magneto-resistive element.

C. STRUCTURE EXAMPLE 3

Structure example 3 relates to a layer structure of a magneto-resistive element.

Figure 23:
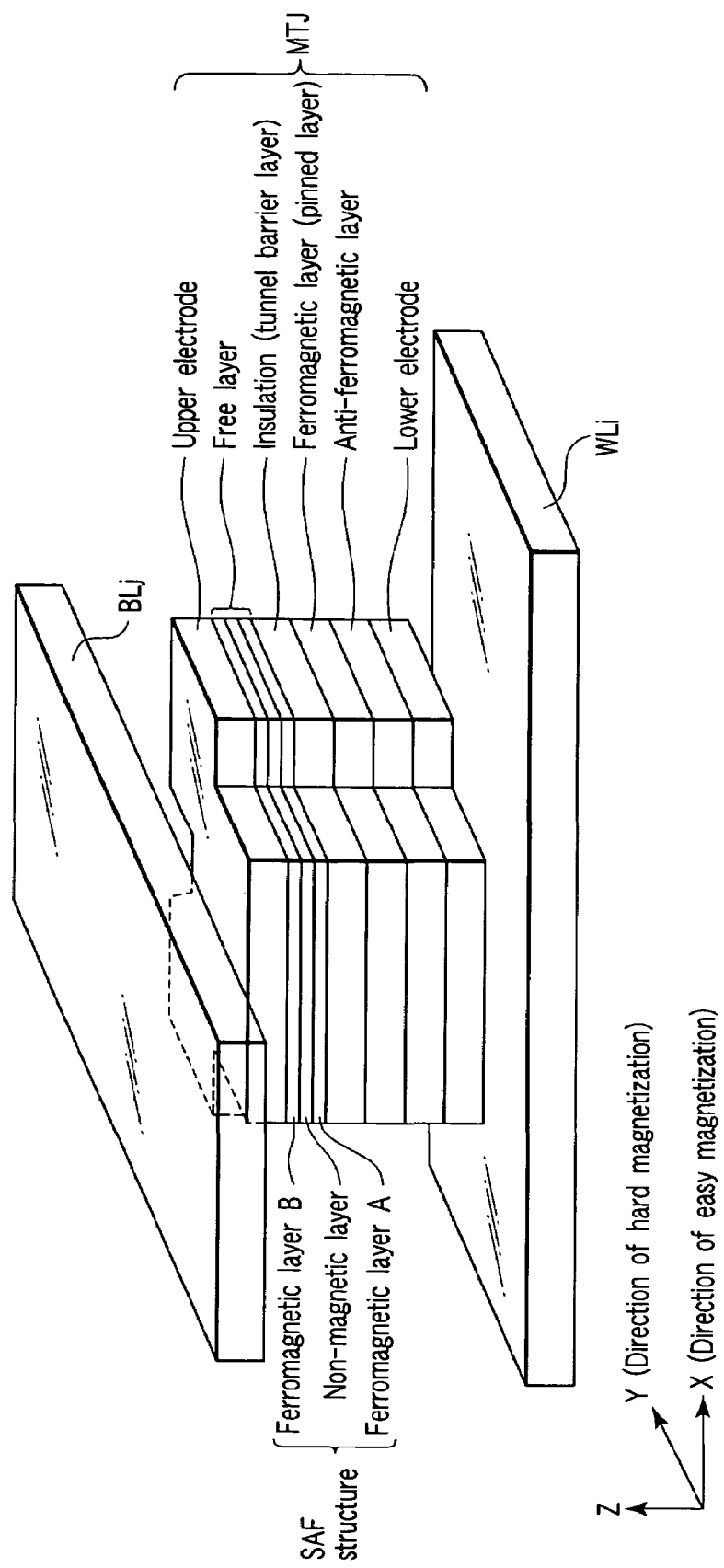
FIG. 23 is a view showing a structure example of a magneto-resistive element.

FIG. 23 shows a layer structure example of the magneto-resistive element.

A magneto-resistive element MJT is arranged at an intersection of a word line WLi and a bit line BLj. The magneto-resistive element MJT has a laminated structure composed of, for example, anti-ferromagnetic layer/ferromagnetic layer (pinned layer)/insulation layer (tunnel barrier layer)/ferromagnetic layer (free layer) and is sandwiched by an upper electrode and a lower electrode.

The free layer has an SAF structure. That is, the free layer has a laminated structure composed of ferromagnetic layer A/non-magnetic layer/ferromagnetic layer B. Further, the two ferromagnetic layers A and B have different anisotropy field HkA and HkB (for example, HkA>HkB) and are weakly anti-ferromagnetic-coupled with each other.

Although this example has employed a bottom pin type in which the pinned layer arranged below the free layer, it may be a top pin type in which the pinned layer arranged above the free layer.

Further, although the pinned layer has been composed of a single layer, alternatively it may be composed of two ferromagnetic layers and a non-magnetic layer arranged between them.

(3) EXAMPLES OF MATERIAL OF MAGNETO-RESISTIVE ELEMENT

Preferably, the material constituting the two ferromagnetic layers of the SAF-structured free layer is NiFe in the present example, but not limited thereto. They may be made of, for example, a metal such as $Co_9Fe_{10}$, Fe, Co, or Ni, a lamination of these metals, or an alloy (CoFeB, CoFeNi, NiFeZr, etc.) containing at least one of these metals.

Here, an anisotropy field Hk2 of one of the two ferromagnetic layers is set to a value not less than 0.1 time to less than 1 time the other anisotropy field Hk1. More preferably, it is 0.9 time or less.

The material constituting the non-magnetic layer interposed between the two ferromagnetic layers may be non-magnetic metal such as Ru, Ir, or Rh or an alloy containing at least one of these metals.

A thickness of the non-magnetic layer is set to, specifically, 0.7 nm or more and preferably a value from not less than 1 nm to not more than 5 nm to get an appropriate anti-ferromagnetic coupling intensity corresponding to p so that an astroid curve opens in the direction of hard magnetization.

In the above example, the intensity of exchange coupling between the two ferromagnetic layers configuring the SAF structure can be adjusted by the thickness of the non-magnetic layer. Alternatively, the intensity of exchange coupling can be adjusted also by making the non-magnetic layer of an alloy and adjusting a composition of the alloy.

The intensity of exchange coupling is defined by parameter hj. In the embodiment of the invention, this parameter hj is set to 0.6 or more and 80 or less, and preferable to a value from not less than 1.1 to not more than 27.

Here, the relation of $hj=J/(Hk \cdot Ms \cdot t)$ is established, where J is coupling energy of the SAF structure, Hk is a larger one of values of the anisotropy field Hk1 and Hk2 of the two ferromagnetic layers, and Ms and t are respectively magnetization and thickness of the ferromagnetic layer having the larger anisotropy field.

By thus adjusting the intensity of exchange coupling in the SAF structure, the intensity of a hard-axis magnetic field that causes data missing is at least twice that of the case where the free layer is composed of only one ferromagnetic layer.

(4) Intensity of Exchange Coupling and Astroid Curve (Results of Experiments)

Figure 24:
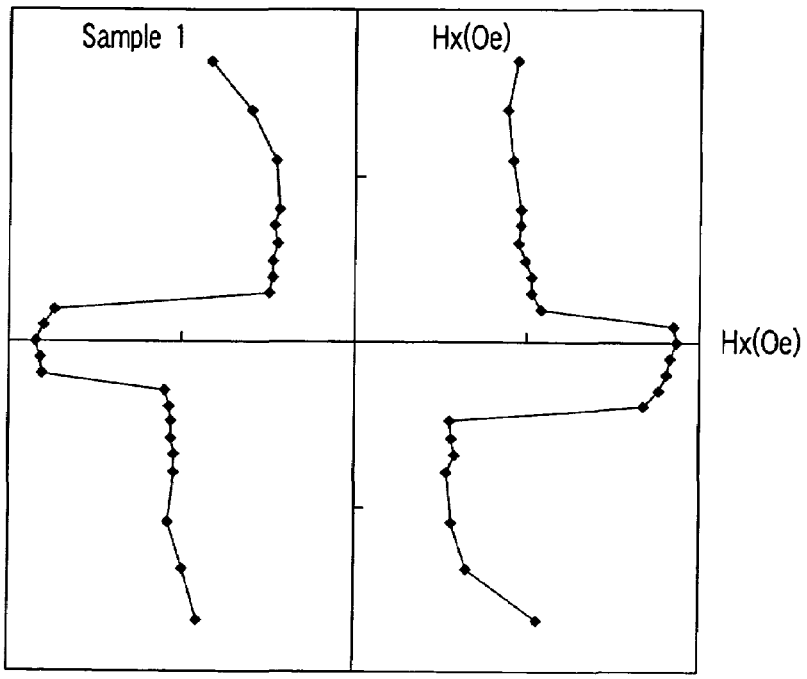
FIG. 24 is a view showing an astroid curve of an SAF having weak exchange coupling.
Figure 25A:
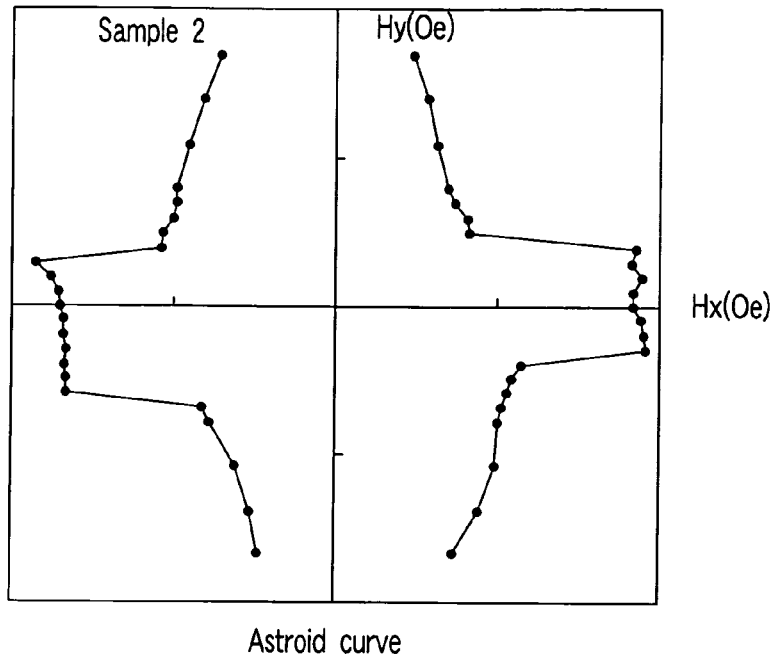
FIG. 25A is a view showing an astroid curve of an SAF having strong exchange coupling.
Figure 25B:
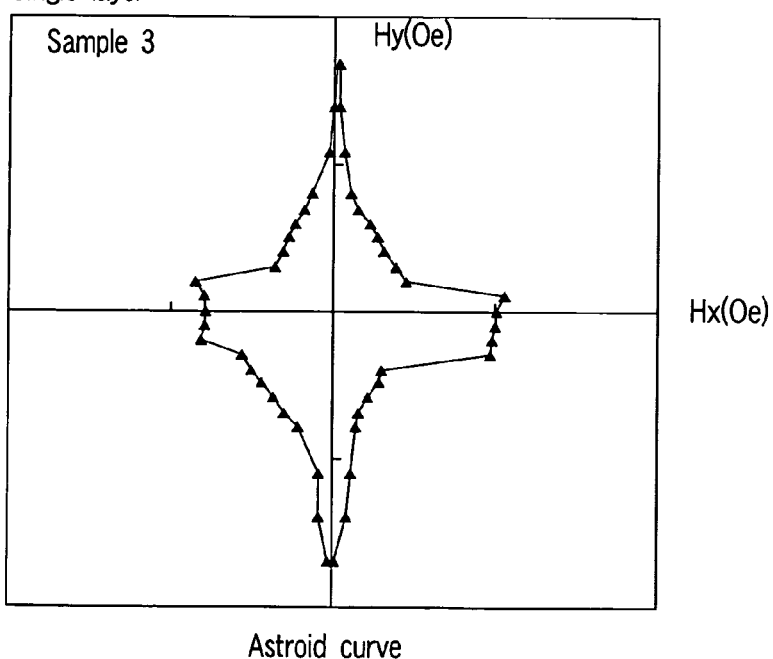
FIG. 25B is a view showing an astroid curve of a free layer having a single-layer structure.

FIGS. 24, 25A and 25B show results of experiments conducted on an astroid curve.

In the experiments, three kinds of samples are prepared to verify how the astroid curve changes with the intensity of exchange coupling.

Sample 1 is an magneto-resistive element whose free layer structure is composed of, downward, NiFe (3 nm)/CoFe(0.5 nm)/Ru(2 nm)/CoFe(0.5 nm)/NiFe (4 nm) layers (parenthesized values indicate thickness), which is an SAF structure having weak exchange coupling (anti-ferromagnetic coupling).

As shown in FIG. 24, astroid characteristics of sample 1 are such that an astroid curve in the direction of hard magnetization opens. In this case, it is possible to realize an idealistic L-shape astroid curve in all of the quadrants, thereby improving write margin.

Sample 2 is an magneto-resistive element whose free layer structure is composed of, downward, NiFe (3 nm)/CoFe(0.5 nm)/Ru(0.8 nm)/CoFe(0.5 nm)/NiFe (4 nm) layers (parenthesized values indicate thickness), which is an SAF structure having strong exchange coupling (anti-ferromagnetic coupling).

As shown in FIG. 25A, astroid characteristics of sample 2 are such that an astroid curve in the direction of hard magnetization closes. In this case, robustness of WL half-selected cells against write disturbance and against themal agitation is weak.

Sample 3 is an magneto-resistive element whose free layer structure is composed of, downward, NiFe (5 nm)/CoFe(0.5 nm) layers (parenthesized values indicate thickness).

As shown in FIG. 25B, astroid characteristics of sample 3 are such that an astroid curve closes in the direction of hard magnetization and Hk and Hc are small. In this case, robustness of both WL half-selected cells and BL half-selected cells against write disturbance and against themal agitation is weak.

That an astroid curve opens means that the curve goes away from the hard axis gradually as the magnetic field in the direction of hard magnetization increases. That an astroid curve closes means that the curve comes closer to the hard axis gradually as the magnetic field in the direction of hard magnetization increases.

(5) Intensity of Exchange Coupling and Astroid Curve (Results of Simulation)

Figure 26A:
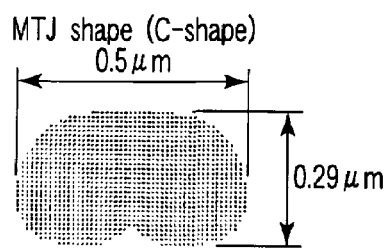
FIG. 26A is a view showing a shape of a magneto-resistive element which was used in the simulation.
Figure 26B:
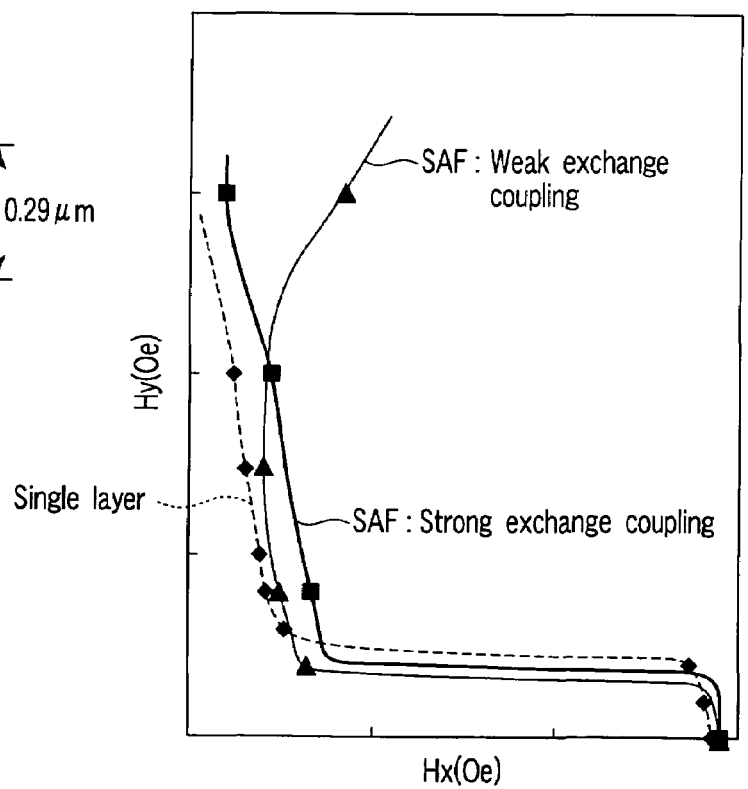
FIG. 26B is a view showing an astroid curve that opens in the direction of hard magnetization.

FIGS. 26A and 26B show results of simulation on astroid characteristics.

The magneto-resistive element has C-shape having a size of 0.5 μm×0.29 μm as shown in FIG. 26A. In FIG. 26B, "SAF: Exchange coupling, weak" corresponds to the conditions of sample 1, "SAF: Exchange coupling, strong" corresponds to the conditions of sample 2, and "single layer" corresponds to the conditions of sample 3.

In this simulation, astroid characteristics substantially the same as those of the above-described results of experiments could be obtained to support these results.

FIGS. 27 to 30 show results of simulation on magnetization state in the case where a magnetic field is applied to a magneto-resistive element having an SAF structure with weak exchange coupling.

Ferromagnetic layers A and B constitute the SAF structure. Coupling energy J is set to 0.02 erg/cm², and an exchange coupling intensity is set to substantially the same value as sample 1 in the above experiments results. In this case, hj is about 2.

It is assumed that, in the SAF structure having weak exchange coupling, multiplication of magnetization and thickness, $M_s t$, for two ferromagnetic layers are set to different values. In this case, one of the ferromagnetic layers (layer A) that has a larger one of the $M_s t$ product obeys an external magnetic field more than the other ferromagnetic layer (layer B) having a smaller one of the product. Due to the anti-ferromagnetic coupling, the direction of magnetization of the layer B is rather opposite to the external magnetic field. However, in the case of weak coupling and strong external field, the direction of magnetization of the layer B tends to obey the external magnetic field. Then, an anti-parallel state collapses.

An anisotropy field, as used herein, is determined by a shape (including a thickness) and a material.

An anisotropy field due to the shape is referred to as a shape anisotropy field, an anisotropy field due to the material is referred to as a material anisotropy field, and an anisotropy field obtained by summing them is referred to as an anisotropy field. The shape anisotropy field is proportional to the $M_s t$ product.

If only a hard axis magnetic field Hy is applied on a magneto-resistive element, the magneto-resistive element is magnetized as shown in FIGS. 27 and 28.

If the value of the hard axis magnetic field intensity Hy is small (Hy=75 Oe), the switching magnetic field Hsw has a small intensity value (Hx) as shown in FIG. 27 because the two ferromagnetic layers A and B are kept in anti-parallel magnetization directions.

In contrast, if the value of the hard axis magnetic field intensity Hy is large (Hy=150 Oe), the switching magnetic field Hsw has a large intensity value as shown in FIG. 28 because the two ferromagnetic layers A and B cannot be kept in the anti-parallel magnetization direction.

That is, as the value of the hard axis field intensity Hy becomes larger, the magnetostatic energy overcomes the coupling energy. Therefore, magnetization of the layer B having a smaller $M_s t$ product than the ferromagnetic layers A is drawn back to the direction of easy magnetization, thereby opening the hard axis astroid curve.

Figure 29:
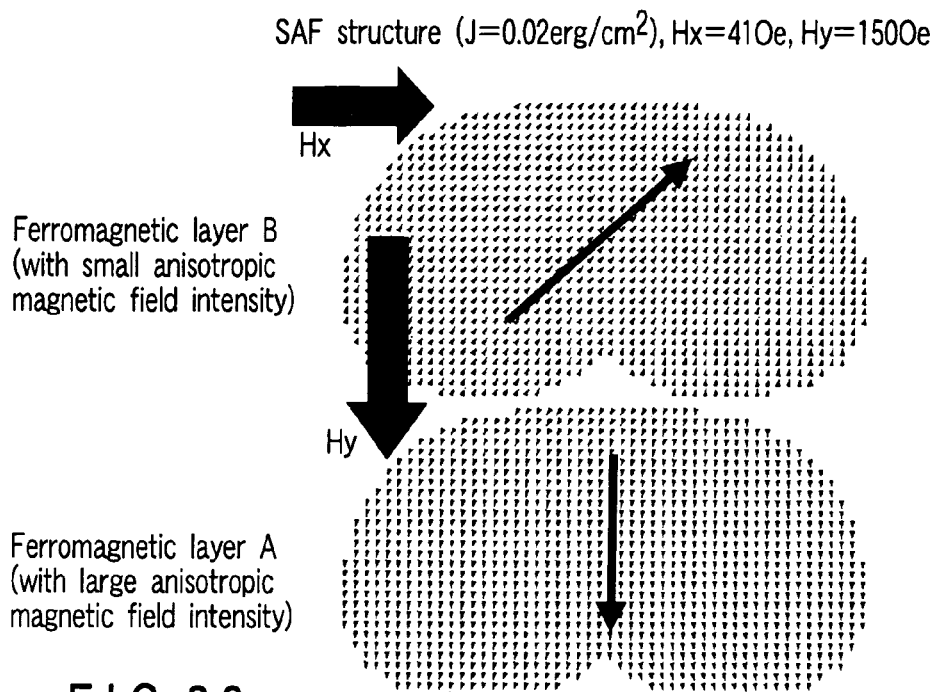
FIG. 29 is a view showing a modeled magnetization state of the magneto-resistive element under magnetic fields in the directions of hard magnetization and easy magnetization.
Figure 30:
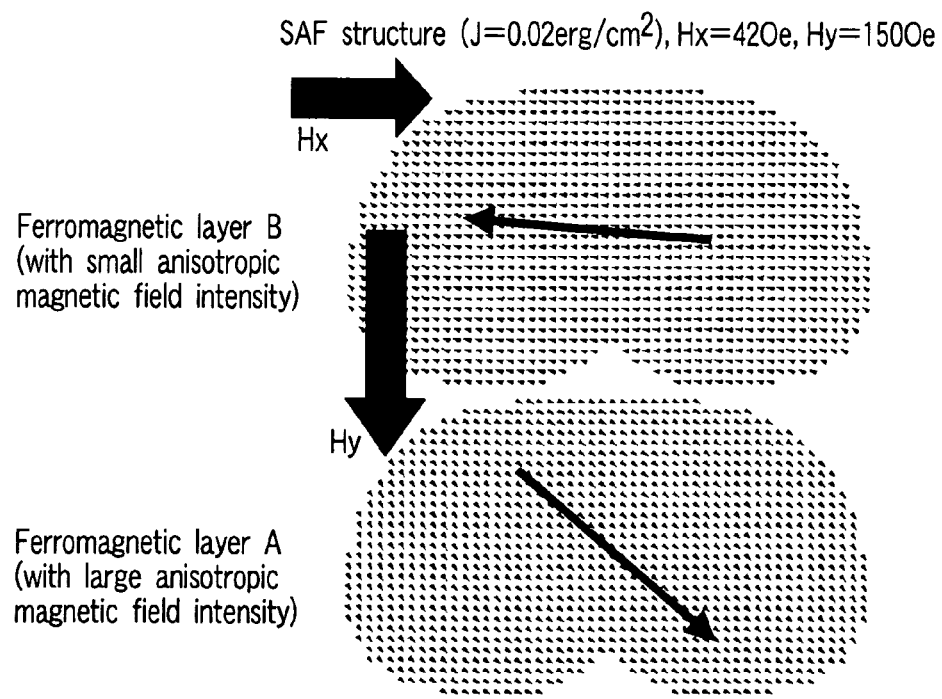
FIG. 30 is a view showing another modeled magnetization state of the magneto-resistive element under magnetic fields in the directions of hard magnetization and easy magnetization.

FIGS. 29 and 30 show how the magneto-resistive element is magnetized when it is supplied with a constant magnetic field Hy in the direction of hard magnetization and further supplied with an easy axis magnetic field Hx that increases little by little.

An intensity of the hard axis magnetic field Hy is set to be constant (Hy=150 Oe) in FIGS. 29 and 30.

FIG. 29 shows a magnetized state immediately before directional reversal of magnetization with Hx=41 Oe.

In contrast, if the easy axial magnetic field intensity Hx is increased a little (Hx=42 Oe), the magnetization direction is reversed as shown in FIG. 30.

(5) CIRCUIT EXAMPLES OF DRIVER/SINKER

The following will describe circuit examples of the driver/sinker.

In the following, circuit examples of the driver/sinker will be described in a case where data is written by using the first and third quadrants of an astroid curve.

Figure 31:
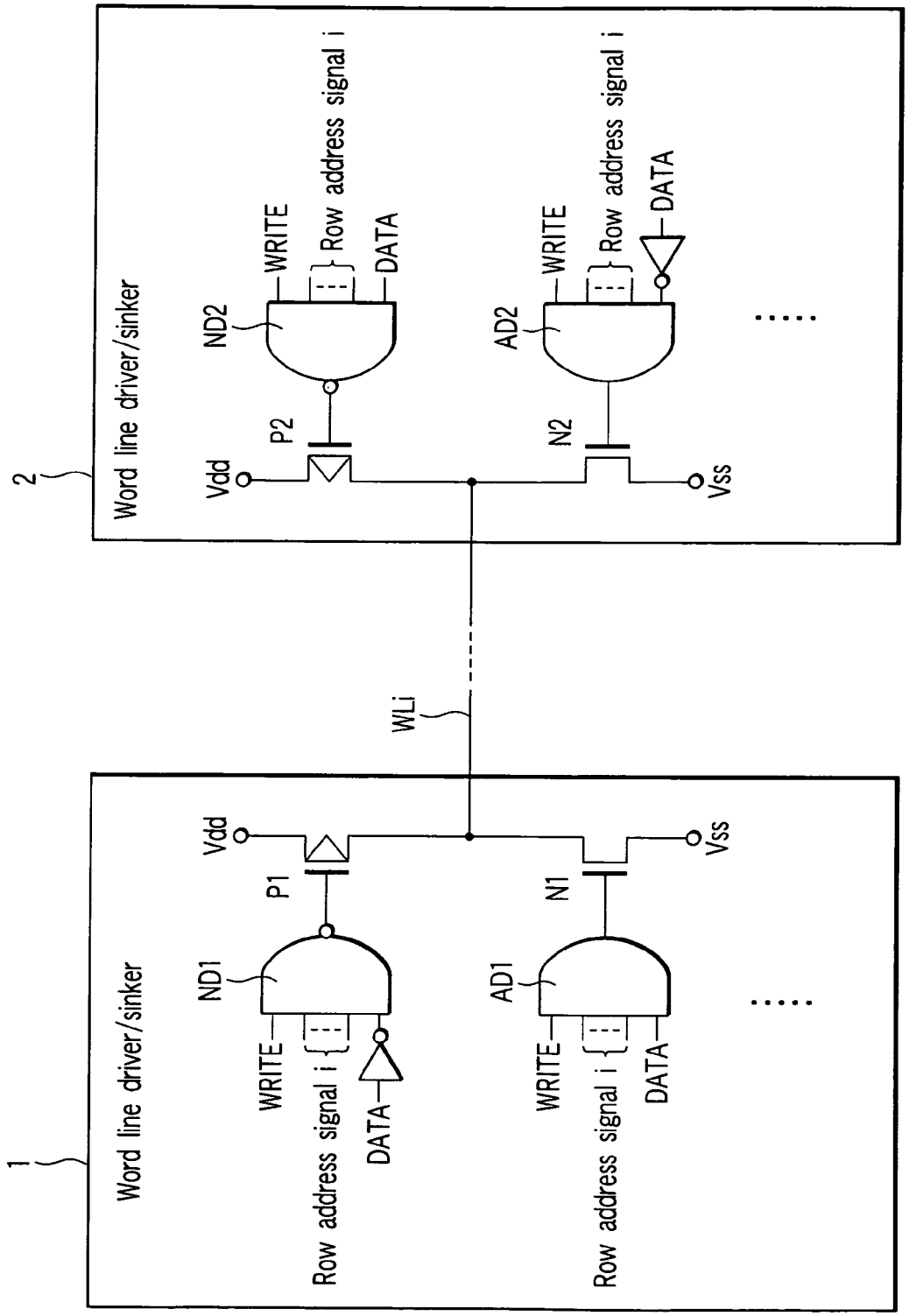
FIG. 31 is a circuit diagram of an example of a word line driver/sinker.

FIG. 31 shows a circuit example of the word line drivers/sinkers.

These word line drivers/sinkers 1 and 2 correspond to, for example, the word line drivers/sinkers 1 and 2 of FIG. 18, respectively.

The word line driver/sinker 1 comprises a P-channel MOS transistor P1 that serves as a driver, an N-channel MOS transistor N1 that serves as a sinker, and an NAND gate circuit ND1 and an AND gate circuit AD1 that serve as a decoder.

The word line driver/sinker 2 comprises a P-channel MOS transistor P2 that serves as a driver, an N-channel MOS transistor N2 that serves as a sinker, and an NAND gate circuit ND2 and an AND gate circuit AD2 that serve as a decoder.

Figure 32:
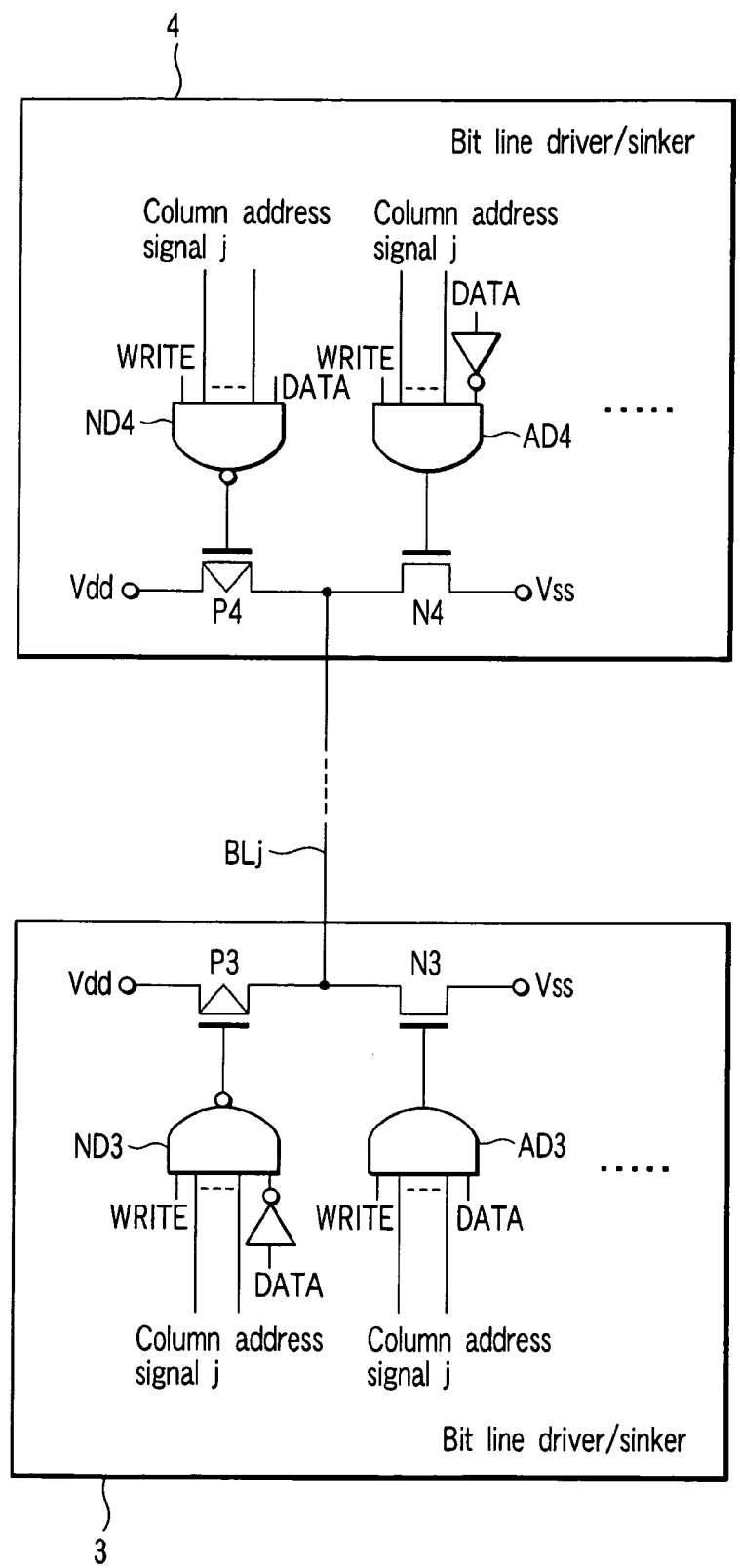
FIG. 32 is a circuit diagram of an example of a bit line driver/sinker.

FIG. 32 shows a circuit example of the bit line drivers/sinkers.

These bit line drivers/sinkers 3 and 4 correspond to, for example, the bit line drivers/sinkers 3 and 4 of FIG. 18, respectively.

The bit line driver/sinker 3 comprises a P-channel MOS transistor P3 that serves as a driver, an N-channel MOS transistor N3 that serves as a sinker, and an NAND gate circuit ND3 and an AND gate circuit AD3 that serve as a decoder.

The bit line driver/sinker 4 comprises a P-channel MOS transistor P4 that serves as a driver, an N-channel MOS transistor N4 that serves as a sinker, and an NAND gate circuit ND4 and an AND gate circuit AD4 that serve as a decoder.

When data is written, a write signal WRITE is turned "H". Further, all bits supplied with a row address signal i for a selected i-th row are turned "H", and all bits supplied with a column address signal j for a selected j-th column are turned "H".

In the case of writing "1" where write data is "1", DATA is turned "H". Consequently, the P-channel MOS transistors P2 and P4 and the N-channel MOS transistors N1 and N3 are turned ON, while the P-channel MOS transistor P1 and P3 and the N-channel MOS transistors N2 and N4 are turned OFF.

As a result, a leftward write current flows from the word line driver/sinker 2 to the word lined river/sinker 1, and a downward write current flows from the bit line driver/sinker 4 to the bit line driver/sinker 3, thereby performing data writing by use of the first quadrant.

In the case of writing "0" where write data is "0", DATA is turned "L". Consequently, the P-channel MOS transistors P1 and P3 and the N-channel MOS transistors N2 and N4 are turned ON, while the P-channel MOS transistor P2 and P4 and the N-channel MOS transistors N1 and N3 are turned OFF.

As a result, a rightward write current flows from the word line driver/sinker 1 to the word lined river/sinker 2, and an upward write current flows from the bit line driver/sinker 3 to the bit line driver/sinker 4, thereby performing data writing by use of the third quadrant.

(6) Manufacturing Method

The following will describe a method of manufacturing a magneto-resistive element according to the embodiment of the invention.

Generally, a resist is exposed to any one of light, electron beams, and an X-ray, and a resist patter is formed by development. Then, by using this resist pattern as a mask, a magnetic material and a non-magnetic material are processed by ion milling or etching, thereby forming a magneto-resistive element.

To form a large-sized, for example, a micron-order magneto-resistive element, a hard mask (which is made of silicon oxide, silicon nitride, etc.) to which a resist pattern has been transferred can be formed. Then, by using this hard mask as a mask, a magnetic material and a non-magnetic material can be processed through reactive ion etching (RIE), thereby obtaining the magneto-resistive element.

To form a small-sized, for example, a sub-micron-order (2 to 3 µm through 0.1 µm) magneto-resistive element, photolithography can be used. In this case, a resist patter is formed by photolithography, and the formed resist pattern is transferred to a hard mask. By using this hard mask as a mask, a magnetic material and a non-magnetic material are processed through reactive ion etching (RIE), thereby obtaining the magneto-resistive element.

To form a fine-sized, for example, a magneto-resistive element having a size of 0.5 µm or less, electron beam exposure can be used. In this case, a resist pattern is formed by electron beam exposure, and the formed resist pattern is transferred to a hard mask. By using this hard mask as a mask, a magnetic material and a non-magnetic material are processed through reactive ion etching (RIE), thereby obtaining the magneto-resistive element.

Besides, a manufacturing method referred to as a two-step process is available as a promising method to obtain a planar shape of a magneto-resistive element according to the embodiment of the invention.

This two-step process relates to a method of manufacturing a hard mask that serves as a mask when a magneto-resistive element is patterned.

FIGS. 33A to 33C show a first example of the two-step process.

In the first example, C-shape of FIG. 14 is formed.

First, as shown in FIG. 33A, a first photolithography-and-etching step is performed to transfer a pattern of a photo resist 11 to a hard mask (which is made of $SiO_2$, for example) 12. At this point in time, the hard mask 12 is trapezoidal (first step).

Next, as shown in FIGS. 33B and 33C, a second photolithography-and-etching step is performed to transfer a pattern of a photo resist 13 to the hard mask 12. That is, a base (or longer side) of the hard mask (trapezoid) 12 is recessed at its middle, thereby forming the C-shape hard mask 12 (second step).

Then, by patterning a magneto-resistive element MTJ by using the hard mask 12, a C-shape magneto-resistive element MTJ is completed.

By such a two-step process, it is possible to easily form a fine C-shape magneto-resistive element having a length of 0.5 μm or less.

Figures 34A, 34B, 34C:
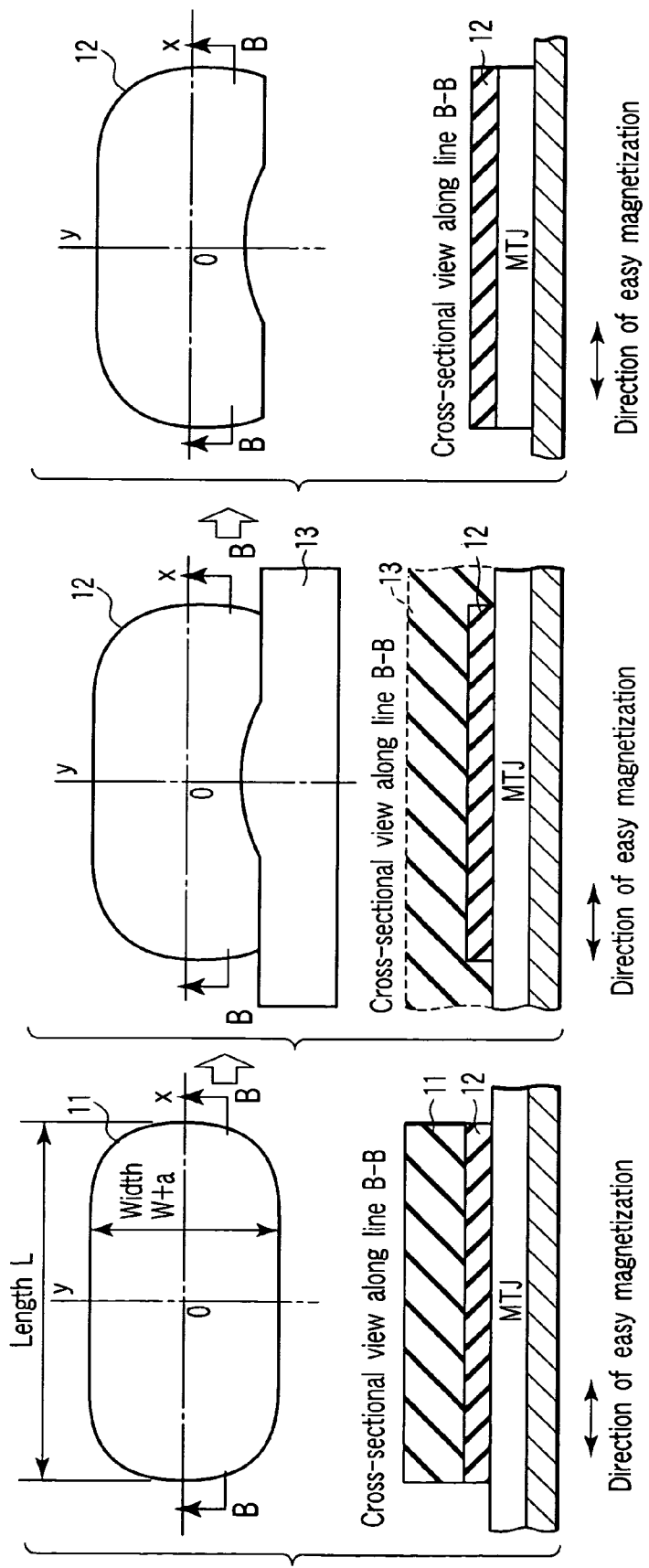
FIGS. 34A to 34C are views each showing a second example (C-shape) of the hard mask manufacturing method.

FIGS. 34A to 34C show a second example of the two-step process.

In the second example also, C-shape of FIG. 14 is formed.

First, as shown in FIG. 34A, a first photolithography-and-etching step is performed to transfer a pattern of a photo resist 11 to a hard mask (which is made of $SiO_2$, for example) 12. At this point in time, the hard mask 12 is trapezoidal, and its width W+α is set larger than an expected completion width W (first step).

Next, as shown in FIGS. 34B and 34C, a second photolithography-and-etching step is performed to transfer a pattern of a photo resist 13 to the hard mask 12. That is, the width W+α of the hard mask 12 (trapezoid) is decreased and its base (or longer side) is recessed at its middle, thereby forming the C-shape hard mask 12 (second step).

Then, by patterning a magneto-resistive element MTJ by using the hard mask 12, a C-shape magneto-resistive element MTJ is completed.

By such a two-step process, it is possible to easily form a fine C-shape magneto-resistive element having a length of 0.5 μm or less. An advantage of this method is that lower-side two corners can be formed sharply almost perpendicularly. This makes a magnetization process preferable.

FIGS. 35A to 35C show a third example of the two-step process.

In the third example, propeller shape of FIG. 15 is formed.

First, as shown in FIG. 35A, a first photolithography-and-etching step is performed to transfer a pattern of a photo resist 11 to a hard mask (which is made of $SiO_2$, for example) 12. At this point in time, a portion that corresponds to the extension of the hard mask 12 is rectangular (first step).

Next, as shown in FIGS. 35B and 35C, a second photolithography-and-etching step is performed to transfer a pattern of a photo resist 13 to the hard mask 12. That is, a shorter side of a portion (rectangle) that corresponds to the extension of the hard mask 12 is cut off obliquely (second step).

Then, by patterning a magneto-resistive element MTJ by using the hard mask 12, the magneto-resistive element MTJ is formed in a propeller shape that has the extension of a parallelogram and arc-shape bulges that protrudes from the extension.

By such a two-step process, it is possible to form the extension of the magneto-resistive element MTJ into a parallelogram whose shorter side is cut off straightly. In this case, asymmetry of the astroid curve becomes remarkable, thereby making effective a write method by use of the first and third quadrants (or second and fourth quadrants).

Figure 36A:
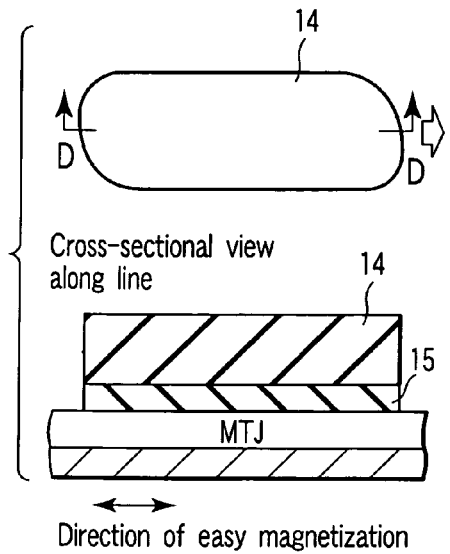
FIGS. 36A to 36D are views each showing a fourth example (propeller shape) of the hard mask manufacturing method.
Figure 36B:
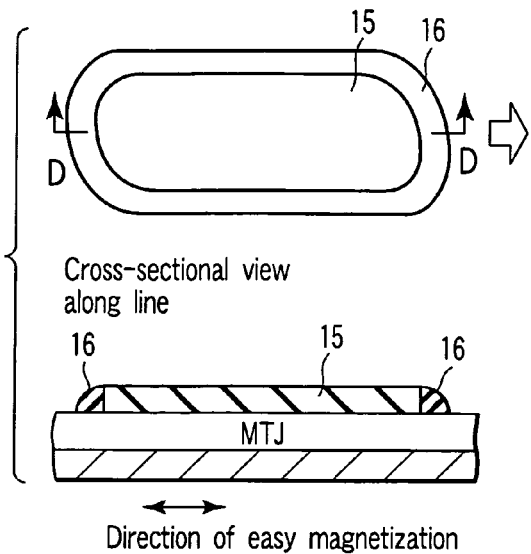
Figure 36C:
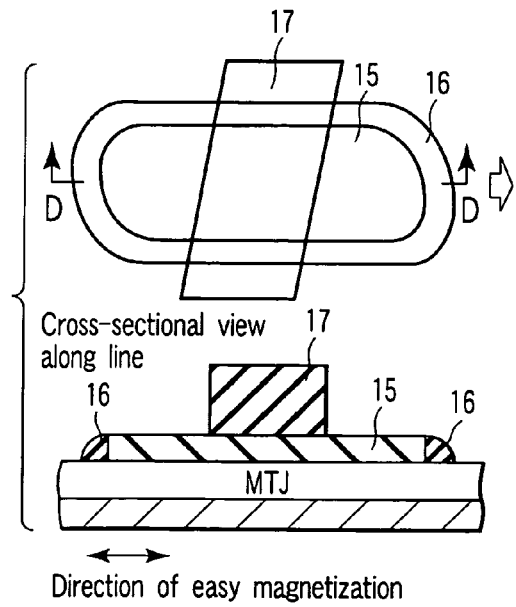

FIGS. 36A to 36C show a fourth example of the two-step process.

In the fourth example also, propeller shape of FIG. 15 is formed.

First, as shown in FIG. 36A, a first photolithography-and-etching step is performed to transfer a pattern of a photo resist 14 to a hard mask (which is made of $SiO_2$, for example) 15. The hard mask 15 determines a shape of an extension of a magneto-resistive element MTJ (first step).

Next, as shown in FIG. 36B, an insulation layer (which is made of SiN, for example) 16 is formed on a sidewall of the hard mask 15.

Figure 36D:
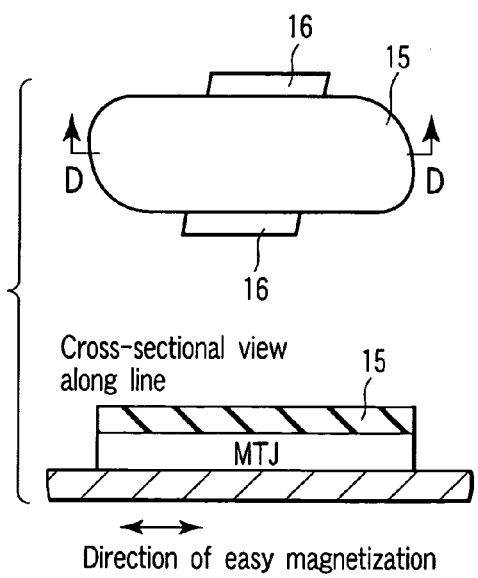

Then, as shown in FIGS. 36C and 36D, a second photolithography-and-etching step is performed to transfer a pattern of a photo resist 17 to the insulation layer 16 serving as a hard mask. The insulation layer 16 as the hard mask determines a shape of bulges of the magneto-resistive element MTJ (second step).

Then, by patterning the magneto-resistive element MTJ by using these hard masks 15 and 16, the magneto-resistive element MTJ is formed in a propeller shape that has the extension of a parallelogram whose shorter side is cut off partially and the bulges that protrude from this extension.

By using a three-step process that combines the third and fourth examples of the two-step process, it is possible to finely form a further preferable MTJ shape.

FIGS. 37A to 37C shows an example of the three-step process.

In the process, shapes of the extension and the bulges are both formed under precise control.

First, as shown in FIG. 37A, a hard mask (which is made of $SiO_2$, for example) that comprises lines and spaces over a plurality of memory cells is formed. Next, as shown in FIG. 37B, an insulation layer (which is made of SiN, for example) 16 is formed on a sidewall of a hard mask 15 (first step).

Then, as shown in FIGS. 37C and 37D, a second photolithography-and-etching step is performed to transfer a pattern of a photo resist 13 to the hard mask 15 and the insulation layer 16. That is, a shape of the extension of the hard mask 15 is determined (second step).

Furthermore, as shown in FIGS. 37E and 37F, a third photolithography-and-etching step is performed to transfer a pattern of a photo resist 17 to the insulation layer 16 serving as a hard mask. The insulation layer 16 as the hard mask determines a shape of the bulges of a magneto-resistive element MTJ (third step).

Then, by patterning the magneto-resistive element MTJ by using these hard masks 15 and 16, the magneto-resistive element MTJ is formed in a propeller shape that has the extension and the bulges whose shapes are both preferable from the viewpoint of magnetic characteristics.

By using such a two-step process or three-step process, it is possible to precisely control the shape of the bulges, thus being effective in reducing dispersion of the astroid curve among many cells.

(7) Method of Writing Information

FIGS. 38A to 38E shows several examples of an information write method applied to a magneto-resistive element according to the embodiment of the invention.

In the method of writing information to a magneto-resistive element proposed in the embodiment of the invention, an important respect is to terminate a magnetic field in the direction of hard magnetization Hy and then terminate a magnetic field in the direction of easy magnetization Hx.

The following will describe write operation characteristics obtained by four information write methods shown in FIGS. 38A to 38D. A gray portion indicates a region where magnetization is not reversed in direction, and a hatched portion indicates a region where magnetization is reversed in direction. A solid-line arrow indicates a magnetic field vector that reverses a magnetization direction of a magnetic free layer from a left direction to a right direction.

Figure 38E:
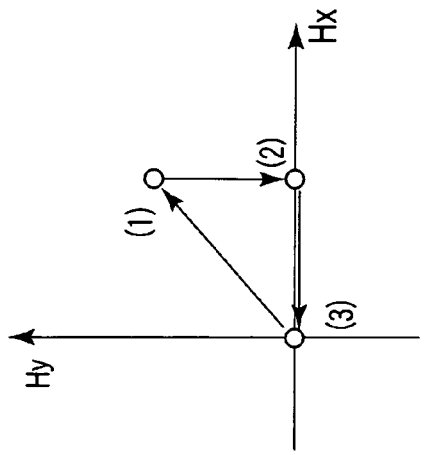
FIGS. 38A to 38E are views each showing an information write method.
Figure 38B:
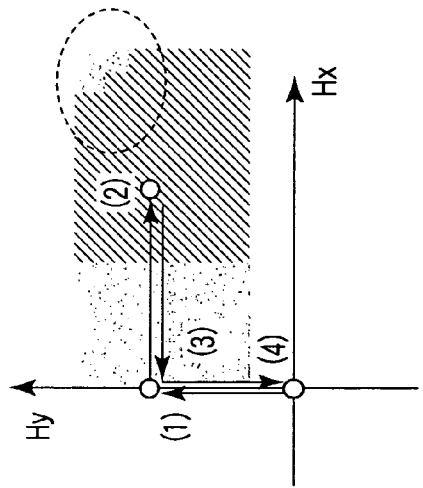
Figure 38D:
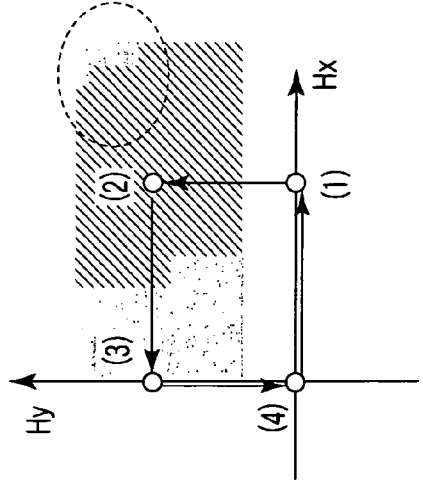
Figure 38A:
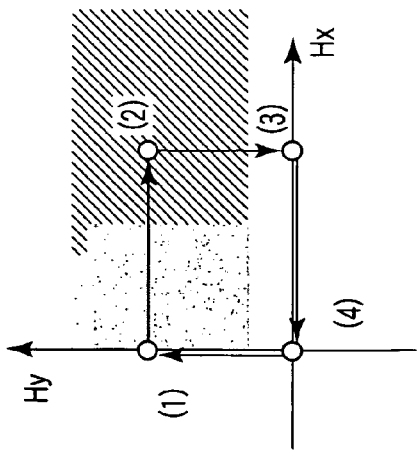
Figure 38C:
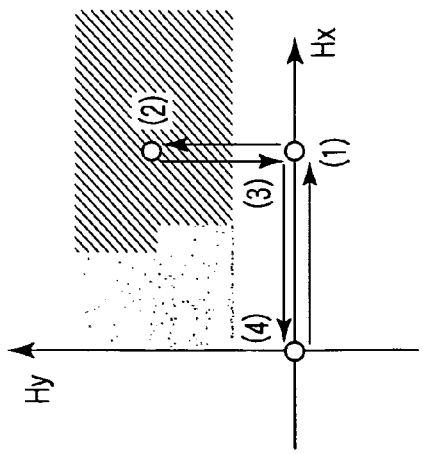

The write method according to the embodiment of the invention relates to how to eliminate a magnetic field after a magnetization direction is reversed as shown in FIG. 38A or 38C, by which first the magnetic field in the direction of hard magnetization Hy is terminated and then the magnetic field in the direction of easy magnetization Hx is terminated.

In contrast, a write method of a comparison example relates to how to eliminate a magnetic field after a magnetization direction is reversed as shown in FIG. 38B or 38D, by which first the magnetic field in the direction of easy magnetization Hx is terminated and then the magnetic field in the direction of hard magnetization Hy is terminated.

In comparison between the embodiment of the invention and the comparison example, the embodiment of the invention gives a remarkably large hatched region and a large operation margin, whereas the comparison example encounters a region encircled by a dotted line where magnetization is not reversed and gives a small operation margin.

A difference in write operation characteristics owing to these write methods indicates that a stable write operation is obtained when the magnetic field in the direction of remanent magnetization after the writing procedure gradually decreases to zero at the end of writing procedure after magnetization reversal. The direction of remanent magnetization after the writing procedure corresponds to the direction of easy magnetization Hx.

As described above, magnetization is reversed in direction, and then, a state in which a magnetic field only in the easy axis Hx is applied is established after a magnetic field in the hard axis Hy is terminated, whereby it is possible to obtain astroid characteristics required for a high density memory.

It is to be noted that a method of generating a magnetic field before magnetization is reversed in direction is not limited in particular.

For example, as shown in FIG. 38A or 38B, the present invention includes a method of which magnetic fields in the hard axis Hy and the easy axis Hx is generated to reverse magnetization after a magnetic field in the hard axis Hy is only generated.

And as shown in FIG. 38C or 38D, the present invention includes a method of which magnetic fields in the hard axis Hy and the easy axis Hx is generated to reverse magnetization after a magnetic field in the easy axis Hx is only generated.

Furthermore, as shown in FIG. 38E, even in a case where magnetic fields in the hard axis Hy and the easy axis Hx are generated simultaneously, the magnetic field in the easy axis Hx is terminated after the magnetic field in the hard axis Hy is terminated, so that the operation margin can be increased.

(8) Miscellaneous

The memory cell array structure (FIG. 18) is based on the assumption that the magneto-resistive elements MTJ are all oriented in the same direction.

However, two magneto-resistive elements MTJ which are adjacent in the x-direction can be laid out mirror-symmetrically or point-symmetrically. Further, two magneto-resistive elements MTJ which are adjacent in the y-direction can be laid out mirror-symmetrically or point-symmetrically.

In these cases, if a one-transistor/one MTJ type cell array structure is employed, one transistor (selected element) can be shared by a plurality of magneto-resistive elements MTJ.

4. Effects

The embodiment of the present invention provides the following effects.

a) By appropriately decreasing the intensity of exchange coupling of the two ferromagnetic layers in an SAF structure according to a ratio in film thickness of the two magnetic layers, an astroid curve opens in the direction of hard magnetization, thereby enabling improving robustness against write disturbance of a half-selected cell to which only a magnetic field is applied in the direction of hard magnetization which is generated by a write current flowing through a word line.

b) Further, by employing such a shape as C or propeller, at least one C-shape magnetic domain is configured in a half-selected cell to which a magnetic field is applied only in the direction of easy magnetization which is generated by a write current flowing through a bit line, thereby enabling improving the robustness against write disturbance similarly.

c) Since an astroid curve is L-shaped in all the quadrants, the write margin increases. Further, by lowering a position of a write point, that is, bringing the write point close to an origin of an switching field characteristic diagram, it is possible to contribute to a decrease in write current and power dissipation.

d) By lowering the position of the write point, it is possible to improve thermal stability of a half-selected cell and to reduce a size of a magneto-resistive element, thereby improving the scalability of the memory cell.

e) Further, by employing the two-step or three-step process, it is possible to reduce, in an actual process, the size of a magneto-resistive element having such a planar shape as C or propeller, thereby providing a magnetic random access memory that has a high integration density and is fast in operation and low in power dissipation.

f) If an astroid curve is asymmetrical in the first and second quadrants (or third and fourth quadrants), data can be written by using the first and third (or second and fourth) quadrants.

g) Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magneto-resistive element comprising:
a free layer whose magnetized state changes; and a pinned layer whose magnetized state is fixed,
the free layer comprising:
first and second ferromagnetic layers; and a non-magnetic layer which is arranged between the first and second ferromagnetic layers,
wherein an intensity of exchange coupling between the first and second ferromagnetic layers is set so that an astroid curve in a direction of hard magnetization opens.

2. The magneto-resistive element according to claim 1, wherein the non-magnetic layer has a thickness not less than 1 nm and not more than 5 nm.

3. The magneto-resistive element according to claim 1, wherein the first and second ferromagnetic layers have different values of multiplication of magnetization and thickness and are not magnetized in anti-parallel directions when a magnetic field only in the direction of hard magnetization is applied.

4. The magneto-resistive element according to claim 3, wherein a relationship between hj and p is expressed as $12p^4 \leq hj \leq 40p^4$ by using a parameter hj and a ratio $p=t'/t$, where the parameter hj is expressed as $hj=J/(Hk \cdot Ms \cdot t)$ by using an anisotropy field intensity Hk of one of the first and second ferromagnetic layers that is larger in an anisotropy field intensity, a magnetization intensity Ms, film thickness t, and coupling energy J of the first and second ferromagnetic layers, and the ratio p indicates a ratio of a film thickness t' of one of the first and second ferromagnetic layer that has a smaller anisotropy field intensity with respect to a film thickness t of the other that has a larger anisotropy field intensity.

5. The magneto-resistive element according to claim 4, wherein a value of the anisotropy field intensity depends on an $M_s t$ product.

6. The magneto-resistive element according to claim 1, wherein the free layer has a shape that is asymmetrical about a centerline in a direction of easy magnetization.

7. The magneto-resistive element according to claim 6, wherein corners of the free layer are all rounded off.

8. The magneto-resistive element according to claim 1, wherein the free layer has two-fold rotational symmetry and has a shape that is not mirror-symmetrical about a centerline extending in a direction of easy magnetization and a centerline extending in the direction of hard magnetization.

9. The magneto-resistive element according to claim 8, wherein corners of the free layer are all rounded off.

10. The magneto-resistive element according to claim 1, wherein the first and second ferromagnetic layers are each made of a material comprising one of Fe, Co and Ni, an alloy including at least one of Fe, Co and Ni, or a lamination including at least one of the material and the alloy.

11. The magneto-resistive element according to claim 1, wherein the non-magnetic layer is made of a material comprising one of Ru, Ir, Rh and Cu, or an alloy including at least one of Ru, Ir, Rh and Cu.

12. A magneto-resistive element comprising:
a free layer whose magnetized state changes; and a pinned layer whose magnetized state is fixed,
the free layer comprising:
first and second ferromagnetic layers; and a non-magnetic layer which is arranged between the first and second ferromagnetic layers,
wherein an intensity of exchange coupling between the first and second ferromagnetic layers is set so that a switching field along the direction of easy magnetization have a local minimum with increasing a magnetic field in the direction of hard magnetization.

13. A magnetic random access memory comprising:
a magneto-resistive element; and
first and second lines which are crossed each other,
wherein the magneto-resistive element is provided between the first and second lines, and comprises a free layer whose magnetized state changes and a pinned layer whose magnetized state is fixed,
wherein the free layer comprises:
first and second ferromagnetic layers; and a non-magnetic layer which is arranged between the first and second ferromagnetic layers,
wherein an intensity of exchange coupling between the first and second ferromagnetic layers is set so that an astroid curve in a direction of hard magnetization opens.

14. A method of writing data to a magneto-resistive element, comprising:
generating a magnetic field in a direction of hard magnetization and a magnetic field in a direction of easy magnetization; and
terminating the magnetic field in the direction of hard magnetization and then terminating the magnetic field in the direction of easy magnetization,
the magneto-resistive element comprising:
a free layer whose magnetized state changes; and a pinned layer whose magnetized state is fixed,
the free layer comprising:
first and second ferromagnetic layers; and a non-magnetic layer which is arranged between the first and second ferromagnetic layers,
wherein an intensity of exchange coupling between the first and second ferromagnetic layers is set so that an astroid curve in a direction of hard magnetization opens.

15. The method according to claim 14, wherein, after the magnetic field in the direction of hard magnetization is generated, the magnetic field in the direction of easy magnetization is generated.

16. The method according to claim 14, wherein, after the magnetic field in the direction of easy magnetization is generated, the magnetic field in the direction of hard magnetization is generated.

17. The method according to claim 14, wherein the magnetic field in the direction of hard magnetization and the magnetic field in the direction of easy magnetization are generated simultaneously.

18. The method according to claim 14, wherein the magneto-resistive element has a synthetic anti-ferromagnetic structure.

* * * * *